(12) United States Patent
Borss et al.

(10) Patent No.: US 10,021,499 B2
(45) Date of Patent: Jul. 10, 2018

(54) APPARATUS AND METHOD FOR EDGE FADING AMPLITUDE PANNING

(71) Applicant: Fraunhofer-Gesellschaft zur Foerderung der angewandten Forschung e.V., Munich (DE)

(72) Inventors: Christian Borss, Erlangen (DE); Bernhard Grill, Rueckersdorf (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/347,493

(22) Filed: Nov. 9, 2016

(65) Prior Publication Data

US 2017/0064484 A1 Mar. 2, 2017

Related U.S. Application Data

(63) Continuation of application No. PCT/EP2014/071449, filed on Oct. 7, 2014.

(30) Foreign Application Priority Data

May 13, 2014 (EP) .................................... 14168175

(51) Int. Cl.
*H04S 5/00* (2006.01)
*H04S 3/00* (2006.01)
(Continued)

(52) U.S. Cl.
CPC ............... *H04S 5/005* (2013.01); *H03G 3/20* (2013.01); *H04S 3/002* (2013.01); *H04S 7/308* (2013.01);
(Continued)

(58) Field of Classification Search
CPC .......... H04S 3/002; H04S 5/005; H04S 7/308; H04S 2400/11; H04S 2400/01; H03G 3/20
(Continued)

(56) References Cited

U.S. PATENT DOCUMENTS 7,583,805 B2  9/2009  Baumgarte et al.
2013/0216047 A1  8/2013  Kuech et al.
(Continued)

FOREIGN PATENT DOCUMENTS

CN  101223819 A  7/2008
CN  102823277 A  12/2012
(Continued)

OTHER PUBLICATIONS

Akio Ando et al.:"Audio engineering Society Convention Paper Sound Internsity based Panning", May 10, 2009, XP055114864.*
(Continued)

*Primary Examiner* — Melur Ramakrishnaiah
(74) *Attorney, Agent, or Firm* — Michael A. Glenn; Perkins Coie LLP

(57) ABSTRACT

An apparatus for generating four or more audio output signals has a panning gain determiner and a signal processor. The panning gain determiner is configured to determine a proper subset from a set of five or more loudspeaker positions, so that the proper subset has four or more of the five or more loudspeaker positions. Moreover, the panning gain determiner is configured to determine the proper subset depending on a panning position and on the five or more loudspeaker positions, and to determine a panning gain for each of the four or more audio output signals by determining the panning gain depending on the panning position and on the four or more loudspeaker positions of the proper subset. The signal processor is configured to generate each of the
(Continued)

four or more audio output signals depending on the panning gain for the audio output signal and on an audio input signal.

46 Claims, 33 Drawing Sheets

(51) Int. Cl.
*H03G 3/20* (2006.01)
*H04S 7/00* (2006.01)

(52) U.S. Cl.
CPC ....... *H04S 2400/01* (2013.01); *H04S 2400/11* (2013.01)

(58) Field of Classification Search
USPC .................................... 381/17–18, 300, 307
See application file for complete search history.

(56) References Cited

U.S. PATENT DOCUMENTS

| | | | |
|---|---|---|---|
| 2013/0329922 A1 | 12/2013 | Lemieux et al. | |
| 2016/0044433 A1* | 2/2016 | Tsingos ................... | H04S 3/002 381/307 |
| 2016/0073215 A1* | 3/2016 | De Bruijn ............... | H04S 7/308 381/17 |

FOREIGN PATENT DOCUMENTS

| | | |
|---|---|---|
| CN | 103583054 A | 2/2014 |
| CN | 104019885 A | 9/2014 |
| EP | 2346028 A1 | 7/2011 |
| EP | 2600343 A1 | 6/2013 |
| EP | 2645748 A1 | 10/2013 |
| JP | 2007194900 A | 8/2007 |
| JP | 2008017117 A | 1/2008 |
| JP | 2010041190 A | 2/2010 |
| JP | 2010252220 A | 11/2010 |
| RU | 2491764 C2 | 8/2013 |
| RU | 2499301 C2 | 11/2013 |
| WO | 2014044332 A1 | 3/2014 |

OTHER PUBLICATIONS

Ando, A. et al., "Sound Intensity Based Three-Dimensional Panning", 126th AES Convention; Munich, Germany, May 2009, 10 pages.
Barber, Bradford C. et al., "The Quickhull Algorithm for Convex Hulls", ACM Transactions on Mathematical Software; vol. 22; No. 4;, Dec. 1996, pp. 469-483.
Bennett, J.C. et al., "A New Approach to the Assessment of Stereophonic Sound System Performance", J. Audio Eng. Soc.; vol. 33; No. 5, May 1985, pp. 314-321.
Craven, P. , "Continuous Surround Panning for 5-Speaker Reproduction", AES 24th Int. Conference; Canada, Jun. 2003, 6 pages.
Frank, M. et al., "Localization Using Different Amplitude-Panning Methods in the Frontal Horizontal Plane", Proc. of the EAA Joint Symposium on Auralization and Ambisonics, Apr. 2014, pp. 41-47.
Gerzon, A. M. , "General Metatheory of Auditory Localisation", 92nd AES Convention; Austria, Mar. 1992, 64 pages.
Gretzki, R. et al., "A New Method for Elevation Panning Reducing the Size of the Resulting Auditory Events", EAA Symposium "TecniAcustica 2003"; Spain, Mar. 22-25, 2004, 2 pages.
ITU-R. REC., "Method for the Subjective Assessment of Intermediate Quality Level of Coding Systems", ITU-R BS.1534-1, 2003, 10 pages.
ITU-R. REC., "Methods for the Subjective Assessment of Small Impairments in Audio Systems Including Multichannel Sound Systems", ITU-R BS.1116-1, 2003, 26 pages.
ITU-R. Rec., "Multichannel Stereophonic Sound System with and without Accompanying Picture", ITU-R BS.775-1, 2006, 10 pages.
ITU-R. REP. , "Framework of Future Audio Representation Systems", ITU-R BS.2266-1, 2013, 10 pages.
Lee, H., "The Relationship Between Interchannel Time and Level Differences in Vertical Sound Localization and Masking", 131st AES Convention; USA, Oct. 2011, 13 pages.
Pernaux, Jean-Marie et al., "Virtual sound source positioning and mixing in 5.1 implementation on the real-time system genesis", First COST-G6 Workshopon Digital Audio Effects (DAFx-98); Spain, 1998, 5 pages.
Pulkki, V. , "Localization of Amplitude-Panned Virtual Sources II: Two- and Three-Dimensional Panning", Journal of the Audio Engineering Society, Audio Engineering Society, New York; vol. 49; No. 9; XP001132351, Sep. 1, 2001, pp. 753-767.
Pulkki, V. et al., "Localization, Coloration, and Enhancement of Amplitude-Panned Virtual Sources", AES 16th Int. Conference; Finland, Apr. 1999, pp. 257-278.
Pulkki, V. , "Uniform Spreading of Amplitude Panned Virtual Sources", IEEE Workshop on Applications of Signal Processing to Audio and Acoustics; USA, Oct. 1999, 4 pages.
Pulkki, V et al., "Virtual Sound Source Positioning Using Vector Base Amplitude Panning", Journal of Audio Eng. Soc. vol. 45, No. 6., Jun. 1997, 456-466.
Silzle, A. , "3D Audio Quality Evaluation: Theory and Practice", International Conference on Spatial Audio (ICSA); Germany, Feb. 2014, 10 pages.
Theile, G. , "Localization of Lateral Phantom-Sources", Journal of the Audio Engineering Society; vol. 25. No. 4, Apr. 1977, pp. 196-200.
Wang, S. et al., "Sound intensity and particle velocity based three-dimensional panning methods by five loudspeakers", IEEE International Conference on Multimedia and Expo (ICME); XP032488096, Jul. 15, 2013, pp. 1-6.

* cited by examiner

APPARATUS AND METHOD FOR EDGE FADING AMPLITUDE PANNING

CROSS-REFERENCE TO RELATED APPLICATIONS

This application is a continuation of copending International Application No. PCT/EP2014/071449, filed Oct. 7, 2014, which claims priority from European Application No. 14168175.9, filed May 13, 2014, which are each incorporated herein in its entirety by this reference thereto.

BACKGROUND OF THE INVENTION

The present invention relates to audio signal processing and, in particular, to an apparatus and a method for edge fading amplitude panning for 3D loudspeaker setups.

After the progression from stereo to 5.1 surround sound, the move towards 3D audio can be regarded as the next step in the evolution of movie and home cinema sound systems. A greater number of loudspeakers can extend the listening area and improve the spatial resolution of the reproduced sound field. However, a greater number of loudspeakers also means a greater demand, because more loudspeakers need to be placed where they are supposed to be. In a domestic environment like a living room it can be difficult to place them according to the specification. In practice, the placement and the number of involved loudspeakers is a compromise between sound quality, costs, aesthetics, spatial limitations, and also domestic/social aspects (see [20]).

Object-based audio scenes do not require a specific loudspeaker configuration like channel-based content and thus have less demands on the placement of the loudspeakers. The rendering process involves a panning method where the object's sound signal is played back by more than one loudspeaker (see [7]).

According to the known technology, for creating auditory events between the loudspeakers of a 3D speaker setup, Vector Base Amplitude Panning (VBAP) is a widely used method, which can be regarded as an extension to the tan-law (see [17], [5]). While this approach has proven its suitability for daily use, it is not ideal in all situations.

In the following VBAP is briefly described. VBAP uses a set of N unit vectors $I_1, \ldots, I_N$ which point at the loudspeakers of the 3D speaker set. A panning direction given by a Cartesian unit vector p is defined by a linear combination of those loudspeaker vectors according to formula (1):

$$p = [l_1, \ldots, l_N][g_1, \ldots, g_N]^T \quad (1)$$

where $g_n$ denotes the scaling factor that is applied to $I_n$. In $\mathbb{R}^3$, a vector space is formed by 3 vector bases.

Formula (1) can generally be solved by a matrix inversion, if the number of active speakers and thus the number of non-zero scaling factors is limited to 3. Practically, this is done by defining a mesh of triangles between the loudspeakers and by choosing those triplets for the area in between. This leads to the solution $$[g_{n_1}, g_{n_2}, g_{n_3}]^T = [l_{n_1}, l_{n_2}, l_{n_3}]^{-1} p \quad (2)$$

where $\{n_1, n_2, n_3\}$ denotes the active loudspeaker triplet.

Finally, a normalization that ensures power normalized output signals results in the final panning gains $a_1, \ldots, a_N$:

$$a_n = \frac{g_n}{\|[g_1, \ldots, g_N]^T\|} \quad (3)$$

VBAP exhibits particular properties. The vector arithmetic based concepts of VBAP are in relation to the sound field which is created by the involved loudspeakers. The base vector that corresponds to a certain loudspeaker, e.g., Gerzon's velocity vector (see [9]), coincides with the particle velocity that can be measured under free field conditions at the listener position. A linear combination of the sound fields created by two or more loudspeakers results in the linear combination of the particle velocity.

VBAP reproduces under free field conditions the particle velocity at the sweet spot that results from a sound source at the panning position.

As the human auditory system senses the sound pressure instead of the particle velocity (see [4]) and further involves directional filtering and cognitive processes, there is actually no direct relation between the underlying vector arithmetic and human localization.

However, sum localization works fairly well for small angles between horizontally arranged loudspeakers in the frontal or rear area [6]. For angles significantly larger than 90°, loudspeakers at the side, or vertically arranged loudspeaker positions, the sum localization is less convincing (see [21], [10], [15]).

FIG. 19 illustrates the VBAP panning gains for a common 5.1 surround setup (see [13]). Between the two rear speakers at 110° and 250°, rather flat curves and a low level difference for a wide angular range are observed. For an angular range where sum localization is not really working, VBAP results in even smaller level differences than for a smaller opening angle where sum localization is working. The reason for this behavior is the great opening angle between the vector bases.

In FIG. 20, a generalized VBAP method using an imaginary loudspeaker (light gray) and a downmix is depicted.

For a 3D loudspeaker setup, VBAP uses 3 base vectors depending on the chosen triangulation. If the 3D setup consists of two or more height layers stacked on top of each other with loudspeakers at the same azimuth angles, then there is no preference for a certain triangulation. For each section between two speakers of a layer, there are two possibilities for subdividing the rectangle between the middle and the upper layer speakers into two triangles. This arbitrary choice introduces an asymmetry even for perfectly symmetric setups. To illustrate this property, let us take a 5.1 setup as an example that has been extended by four height speakers above the M30, M-30, M110, and M-110 speakers i.e., U30, U-30, U110, and U-110 [14]. Between the middle and the upper layer surround speakers, the subdivision into the two triangles can either be defined by the diagonal M110↔U-110 or by the diagonal U110↔M-110. The same holds for the area above/between the upper layer loudspeakers. Whatever choice is made, it breaks the left-right symmetry. As a consequence, an audio object that moves from the upper front right to the upper rear left would sound different then if it would move from upper front left to upper rear right—despite the symmetry of the loudspeaker setup.

SUMMARY

According to an embodiment, an apparatus for generating four or more audio output signals may have: a panning gain determiner, and a signal processor, wherein the panning gain determiner is configured to determine a proper subset from a set of five or more loudspeaker positions, so that the proper subset has four or more of the five or more loudspeaker positions, wherein the panning gain determiner is configured to determine the proper subset depending on a panning position and depending on the five or more loudspeaker positions, wherein the panning gain determiner is configured to determine a panning gain for each of the four or more audio output signals by determining said panning gain depending on the panning position and depending on the four or more loudspeaker positions of the proper subset, and wherein the signal processor is configured to generate each audio output signal of the four or more audio output signals depending on the panning gain for said audio output signal and depending on an audio input signal.

According to another embodiment, a system may have: five or more loudspeakers, and an apparatus for generating four or more audio output signals as mentioned above, wherein each of the five or more loudspeakers is associated with exactly one loudspeaker position of the set of five or more loudspeaker positions, wherein each of the four or more audio output signals is associated with exactly one loudspeaker position of the four or more loudspeaker positions of the proper subset, and wherein each of the four or more audio output signals is associated with exactly one of the four or more loudspeaker positions of the proper subset, wherein the system is configured to output each audio output signal of the four or more audio output signals by the loudspeaker which is associated with the same loudspeaker position as said audio output signal.

According to another embodiment, a method for generating four or more audio output signals may have the steps of: determining a proper subset from a set of five or more loudspeaker positions, so that the proper subset has four or more of the five or more loudspeaker positions, wherein determining the proper subset is conducted depending on a panning position and depending on the five or more loudspeaker positions, determining a panning gain for each of the four or more audio output signals by determining said panning gain depending on the panning position and depending on the four or more loudspeaker positions of the proper subset, and generating each audio output signal of the four or more audio output signals depending on the panning gain for said audio output signal and depending on an audio input signal.

Another embodiment may have a computer program for implementing a method for generating four or more audio output signals may have the steps of: determining a proper subset from a set of five or more loudspeaker positions, so that the proper subset has four or more of the five or more loudspeaker positions, wherein determining the proper subset is conducted depending on a panning position and depending on the five or more loudspeaker positions, determining a panning gain for each of the four or more audio output signals by determining said panning gain depending on the panning position and depending on the four or more loudspeaker positions of the proper subset, and generating each audio output signal of the four or more audio output signals depending on the panning gain for said audio output signal and depending on an audio input signal, when being executed on a computer or signal processor.

According to still another embodiment, an apparatus for generating four or more audio output signals, wherein each loudspeaker position of four or more loudspeaker positions is associated with exactly one of the four or more audio output signals, and wherein each of the four or more audio output signals is associated with exactly one of the four or more loudspeaker positions, may have: a panning gain determiner, and a signal processor, wherein the panning gain determiner is configured to determine, for each audio output signal of the four or more audio output signals, a group of associated loudspeaker positions, being associated with said audio output signal, depending on the loudspeaker position of each of the four or more audio output signals and depending on a panning position, so that said group of associated loudspeaker positions has the loudspeaker position being associated with said audio output signal and at least two further loudspeaker positions of the four or more loudspeaker positions, wherein at least one of the four or more loudspeaker positions is not comprised by said group of associated loudspeaker positions, wherein the panning gain determiner is configured to calculate, for each audio output signal of the four or more audio output signals, the panning gain for said audio output signal depending on the panning position and depending on the loudspeaker positions of the group of associated loudspeaker positions being associated with said audio output signal, and wherein the signal processor is configured to generate each audio output signal of the four or more audio output signals depending on the panning gain for said audio output signal and depending on an audio input signal, wherein the group of associated loudspeaker positions being associated with a first one of the four or more audio output signals is not equal to the group of associated loudspeaker positions being associated with a different second one of the four or more audio output signals.

According to another embodiment, a method for generating four or more audio output signals, wherein each loudspeaker position of four or more loudspeaker positions is associated with exactly one of the four or more audio output signals, and wherein each of the four or more audio output signals is associated with exactly one of the four or more loudspeaker positions, may have the steps of: determining, for each audio output signal of the four or more audio output signals, a group of associated loudspeaker positions, being associated with said audio output signal, depending on the loudspeaker position of each of the four or more audio output signals and depending on a panning position, so that said group of associated loudspeaker positions has the loudspeaker position being associated with said audio output signal and at least two further loudspeaker positions of the four or more loudspeaker positions, wherein at least one of the four or more loudspeaker positions is not comprised by said group of associated loudspeaker positions, calculating, for each audio output signal of the four or more audio output signals, the panning gain for said audio output signal depending on the panning position and depending on the loudspeaker positions of the group of associated loudspeaker positions being associated with said audio output signal, and generating each audio output signal of the four or more audio output signals depending on the panning gain for said audio output signal and depending on an audio input signal, wherein the group of associated loudspeaker positions being associated with a first one of the four or more audio output signals is not equal to the group of associated loudspeaker positions being associated with a different second one of the four or more audio output signals.

Another embodiment may have a computer program for implementing a method for generating four or more audio output signals, wherein each loudspeaker position of four or more loudspeaker positions is associated with exactly one of the four or more audio output signals, and wherein each of the four or more audio output signals is associated with exactly one of the four or more loudspeaker positions, may have the steps of: determining, for each audio output signal of the four or more audio output signals, a group of associated loudspeaker positions, being associated with said audio output signal, depending on the loudspeaker position of each of the four or more audio output signals and depending on a panning position, so that said group of associated loudspeaker positions has the loudspeaker position being associated with said audio output signal and at least two further loudspeaker positions of the four or more loudspeaker positions, wherein at least one of the four or more loudspeaker positions is not comprised by said group of associated loudspeaker positions, calculating, for each audio output signal of the four or more audio output signals, the panning gain for said audio output signal depending on the panning position and depending on the loudspeaker positions of the group of associated loudspeaker positions being associated with said audio output signal, and generating each audio output signal of the four or more audio output signals depending on the panning gain for said audio output signal and depending on an audio input signal, wherein the group of associated loudspeaker positions being associated with a first one of the four or more audio output signals is not equal to the group of associated loudspeaker positions being associated with a different second one of the four or more audio output signals, when being executed on a computer or signal processor.

An apparatus for generating four or more audio output signals is provided. The apparatus comprises a panning gain determiner and a signal processor. The panning gain determiner is configured to determine a proper subset from a set of five or more loudspeaker positions, so that the proper subset comprises four or more of the five or more loudspeaker positions. Moreover, the panning gain determiner is configured to determine the proper subset depending on a panning position and depending on the five or more loudspeaker positions. Furthermore, the panning gain determiner is configured to determine a panning gain for each of the four or more audio output signals by determining said panning gain depending on the panning position and depending on the four or more loudspeaker positions of the proper subset. The signal processor is configured to generate each audio output signal of the four or more audio output signals depending on the panning gain for said audio output signal and depending on an audio input signal.

Moreover, a method for generating four or more audio output signals is provided. The method comprises:

Determining a proper subset from a set of five or more loudspeaker positions, so that the proper subset comprises four or more of the five or more loudspeaker positions, wherein determining the proper subset is conducted depending on a panning position and depending on the five or more loudspeaker positions.

Determining a panning gain for each of the four or more audio output signals by determining said panning gain depending on the panning position and depending on the four or more loudspeaker positions of the proper subset. And:

Generating each audio output signal of the four or more audio output signals depending on the panning gain for said audio output signal and depending on an audio input signal.

Furthermore, a computer program for implementing the above-described method when being executed on a computer or signal processor is provided.

Moreover, an apparatus for generating four or more audio output signals is provided. Each loudspeaker position of four or more loudspeaker positions is associated with exactly one of the four or more audio output signals, and wherein each of the four or more audio output signals is associated with exactly one of the four or more loudspeaker positions. The apparatus comprises a panning gain determiner, and a signal processor. The panning gain determiner is configured to determine, for each audio output signal of the four or more audio output signals, a group of associated loudspeaker positions, being associated with said audio output signal, depending on the loudspeaker position of each of the four or more audio output signals and depending on a panning position, so that said group of associated loudspeaker positions comprises the loudspeaker position being associated with said audio output signal and at least two further loudspeaker positions of the four or more loudspeaker positions, wherein at least one of the four or more loudspeaker positions is not comprised by said group of associated loudspeaker positions. Moreover, the panning gain determiner is configured to calculate, for each audio output signal of the four or more audio output signals, the panning gain for said audio output signal depending on the panning position and depending on the loudspeaker positions of the group of associated loudspeaker positions being associated with said audio output signal. The signal processor is configured to generate each audio output signal of the four or more audio output signals depending on the panning gain for said audio output signal and depending on an audio input signal. The group of associated loudspeaker positions being associated with a first one of the four or more audio output signals is not equal to the group of associated loudspeaker positions being associated with a different second one of the four or more audio output signals.

Furthermore, a method for generating four or more audio output signals is provided. Each loudspeaker position of four or more loudspeaker positions is associated with exactly one of the four or more audio output signals, and wherein each of the four or more audio output signals is associated with exactly one of the four or more loudspeaker positions. The method comprises:

Determining, for each audio output signal of the four or more audio output signals, a group of associated loudspeaker positions, being associated with said audio output signal, depending on the loudspeaker position of each of the four or more audio output signals and depending on a panning position, so that said group of associated loudspeaker positions comprises the loudspeaker position being associated with said audio output signal and at least two further loudspeaker positions of the four or more loudspeaker positions, wherein at least one of the four or more loudspeaker positions is not comprised by said group of associated loudspeaker positions, Calculating, for each audio output signal of the four or more audio output signals, the panning gain for said audio output signal depending on the panning position and depending on the loudspeaker positions of the group of associated loudspeaker positions being associated with said audio output signal. And:

Generating each audio output signal of the four or more audio output signals depending on the panning gain for said audio output signal and depending on an audio input signal.

The group of associated loudspeaker positions being associated with a first one of the four or more audio output signals is not equal to the group of associated loudspeaker positions being associated with a different second one of the four or more audio output signals.

Furthermore, a computer program for implementing the above-described method when being executed on a computer or signal processor is provided.

The provided concepts provide a requirement-driven concept for amplitude panning.

BRIEF DESCRIPTION OF THE DRAWINGS

In the following, embodiments of the present invention are described in more detail with reference to the figures, in which.

DETAILED DESCRIPTION OF THE INVENTION

Figure 1:
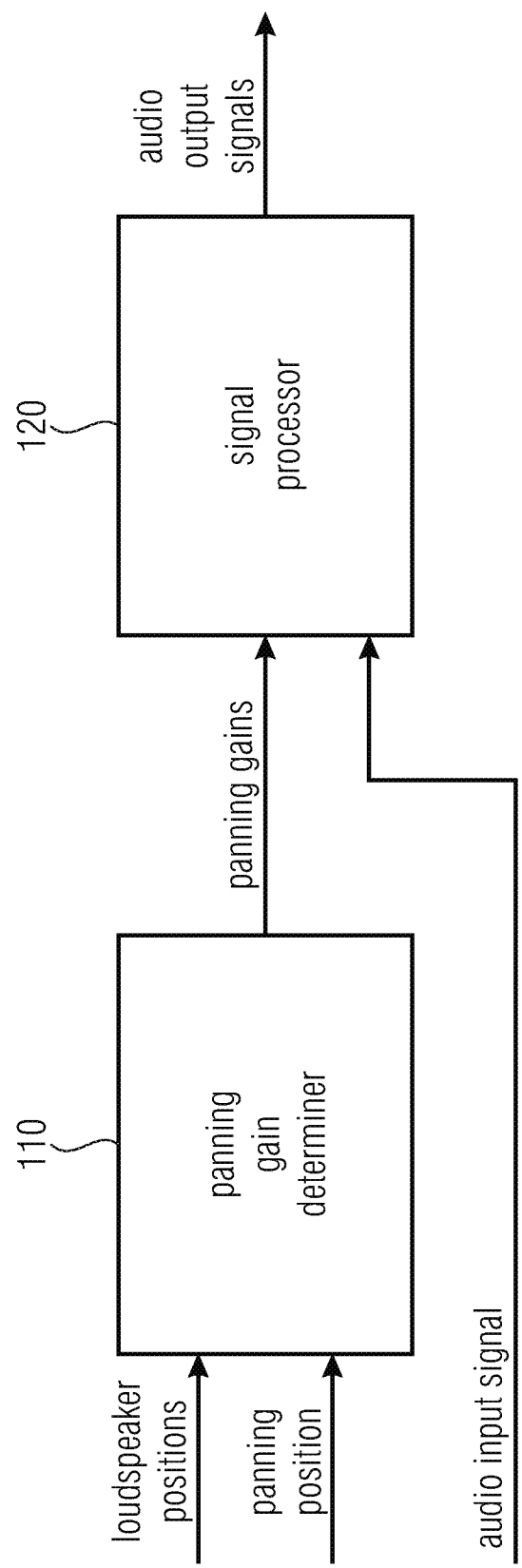
FIG. 1 is an apparatus according to an embodiment.

FIG. 1 illustrates an apparatus for generating four or more audio output signals according to an embodiment. The apparatus comprises a panning gain determiner 110 and a signal processor 120.

The panning gain determiner 110 is configured to determine a proper subset from a set of five or more loudspeaker positions, so that the proper subset comprises four or more of the five or more loudspeaker positions, wherein the panning gain determiner 110 is configured to determine the proper subset depending on a panning position and depending on the five or more loudspeaker positions.

Moreover, the panning gain determiner 110 is configured to determine a panning gain for each of the four or more audio output signals by determining said panning gain depending on the panning position and depending on the four or more loudspeaker positions of the proper subset.

The signal processor 120 is configured to generate each audio output signal of the four or more audio output signals depending on the panning gain for said audio output signal and depending on an audio input signal.

A proper subset of a set of five or more loudspeaker positions is a subset of the five or more loudspeaker positions which does not comprise at least one of the five or more loudspeaker positions.

As described the panning gain determiner is configured to determine a proper subset from a plurality of five or more loudspeaker positions, so that at least four loudspeaker positions are comprised by the subset.

This is explained with reference to FIGS. 2-6.

Figure 2:
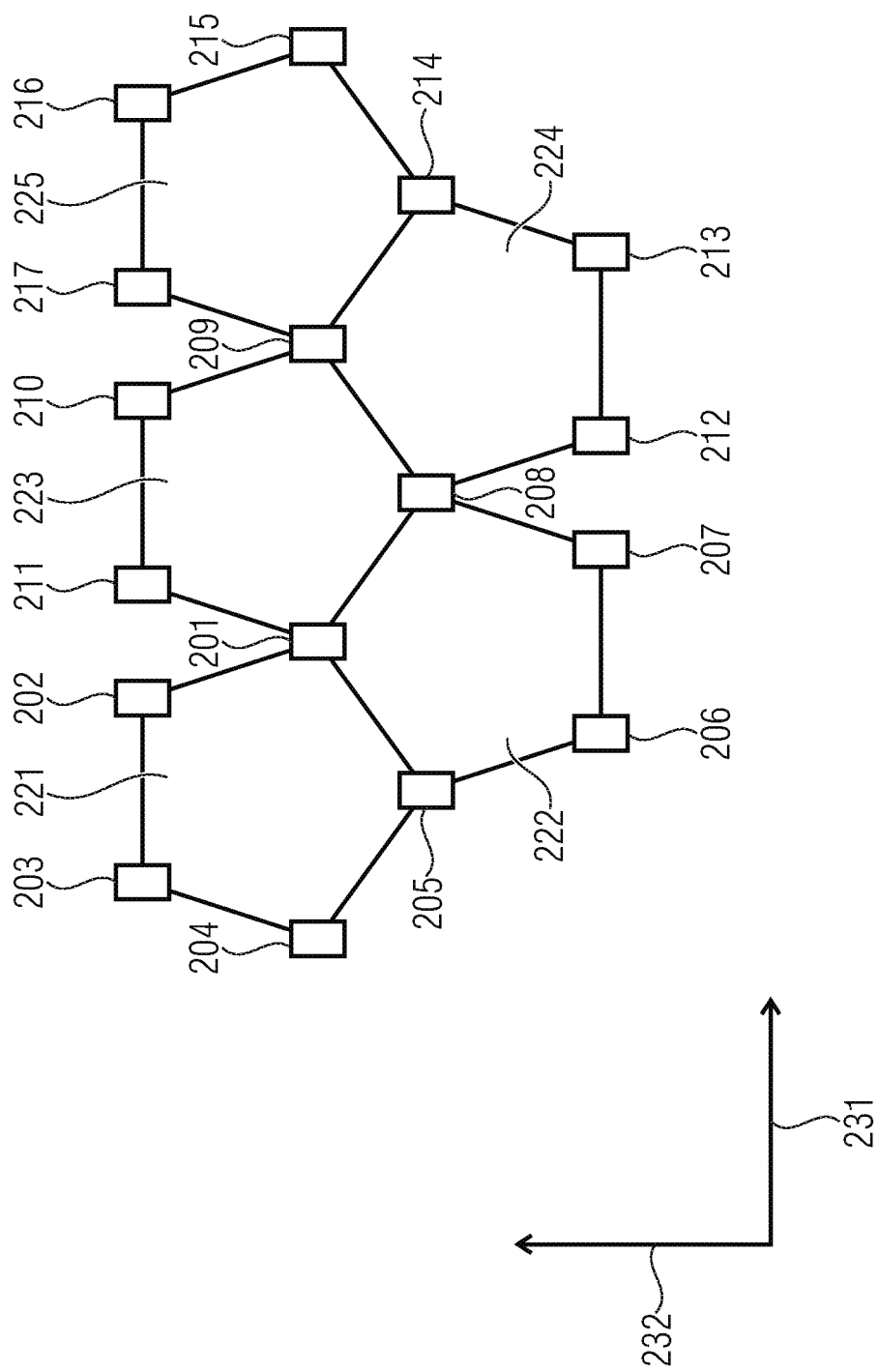
FIG. 2 illustrates 17 loudspeakers at 17 loudspeaker positions.

FIG. 2 illustrates 17 loudspeakers at 17 loudspeaker positions 201-217. The 17 loudspeaker positions 201-217 define five pentagons 221, 222, 223, 224 and 225. In particular, the pentagon 221 is defined by a polygon with the vertices 201, 202, 203, 204 and 205. The pentagon 222 is defined by a polygon with the vertices 201, 205, 206, 207 and 208. The pentagon 223 is defined by a polygon with the vertices 201, 208, 209, 210 and 211. The pentagon 224 is defined by a polygon with the vertices 208, 212, 213, 214 and 209. And, the pentagon 225 is defined by a polygon with the vertices 209, 214, 215, 216 and 217.

In FIG. 2 it may be assumed that the loudspeaker positions are positions within a two-dimensional coordinate system.

For example, the horizontal axis 231 of the two-dimensional coordinate system may, e.g., indicate an azimuth angle θ of the loudspeaker position, and the vertical axis 232 of the coordinate system may, e.g., indicate an elevation angle φ of the coordinate system. Thus, in all loudspeaker positions that are described only by an azimuth angle or an elevation angle may be positions (assumed to be) located on a sphere in the real three-dimensional world.

Or, for example, the horizontal axis 231 of the coordinate system may, e.g., indicate an abscissa (x-axis) coordinate value of the loudspeaker position, and the vertical axis 232 of the coordinate system may, e.g., indicate an ordinate (y-axis) of a Cartesian coordinate system. For example, in the real-dimensional world, all loudspeakers may be located in a plane.

In FIG. 2, the bodies defined by the polygons are convex. For example, the body defined by the polygon with the vertices 201, 202, 203, 204 and 205 is convex. Moreover, for example, the body defined by the polygon with the vertices 201, 205, 206, 207 and 208 is convex.

Moreover, the five polygons which define the five pentagons do not enclose any other loudspeaker position which does not belong to the respective polygon. For example, the polygon with the vertices 201, 202, 203, 204 and 205 does not enclose any of the loudspeaker positions 206-217.

Figure 3:
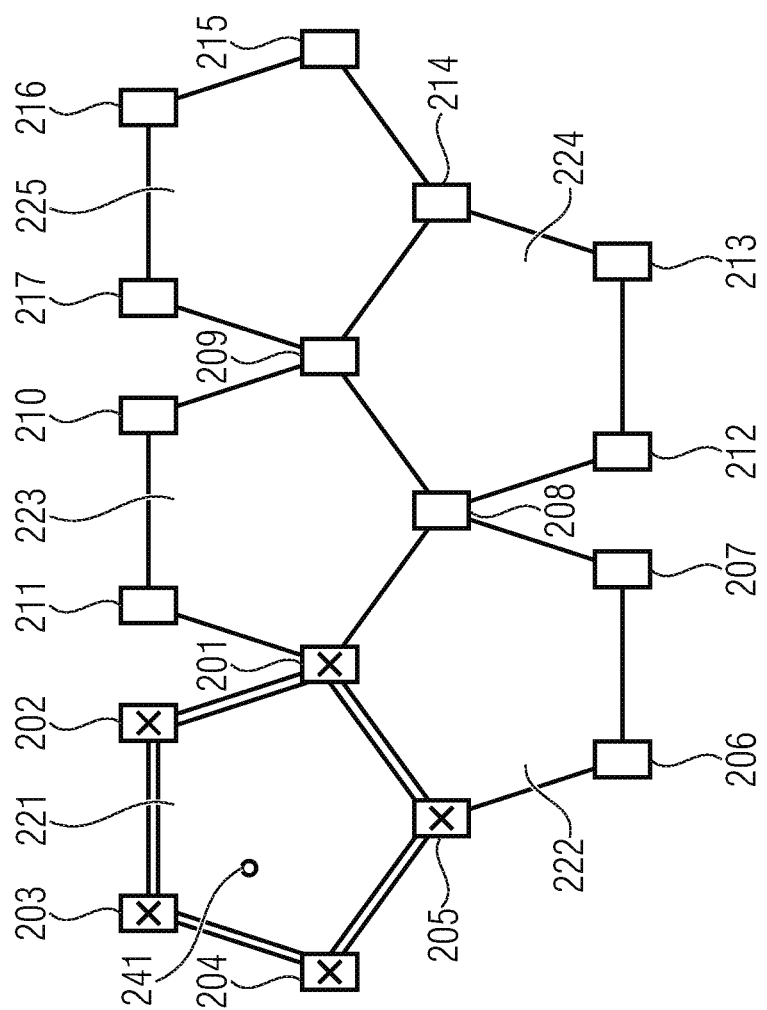
FIG. 3 illustrates an example for a determination of a proper subset of loudspeaker positions according to an embodiment dependent on a first panning position.

In FIG. 3, a panning position 241 is indicated. The loudspeaker arrangement shall now reproduce an audio input signal, as if the source emitting the audio input signal would be located at the panning position.

The panning gain determiner 110 of FIG. 1 may, e.g., be configured to determine one of the polygons mentioned-above that enclose the panning position to determine the subset of loudspeaker positions. In the example of FIG. 3, this is the (subset-specific) polygon with the vertices 201, 202, 203, 204 and 205. Thus the loudspeaker positions 201, 202, 203, 204 and 205 are the (only) elements of the proper subset of loudspeaker positions. Vice-versa, the polygon that defines the subset is subset-specific for the subset and can thus be referred to as subset-specific polygon.

The panning gain determiner is now configured to determine a panning gain for each of the audio output signals depending on the panning position and depending on the loudspeaker positions of the (preselected) subset.

After the loudspeaker positions of the proper subset have been determined, it is not necessary to further consider the other loudspeaker positions for determining the panning gains.

Embodiments are based on the finding that to reproduce the audio input signal as if it would originate from the panning position 241, it is sufficient that only the loudspeakers 201, 202, 203, 204 and 205 output an output signal. The other loudspeakers are not needed.

As each audio output signal is generated for a particular loudspeaker position (or, in other words, for a loudspeaker which is associated with, or, e.g., positioned at, that particular loudspeaker position), it is sufficient to generate only the audio output signals for the loudspeakers at the loudspeaker positions of the proper subset, to reproduce an audio output signal, as if it would be emitted from the panning position.

Thus, for generating the audio output signals, only one panning gain for each of the audio output signals is needed to reproduce the audio input signal as if emitted from the panning position. Moreover, for determining the panning gain, as the audio input signal is panned between the loudspeakers associated with the loudspeaker positions of the proper subset, only the panning position and the loudspeaker positions of the proper subset have to be taken into account.

Therefore, these embodiments are advantageous, as only a reduced number of loudspeaker positions has to be considered, what reduces complexity.

Moreover, embodiments are based on the finding that at least four loudspeaker positions shall be in the subset, as at least four speakers should be employed to represent an audio input signal in the panning position. Embodiments are also based on the finding that a reproduction of the audio input signal by only three speakers or less has disadvantages compared to using four or more speakers, in particular, when the panning position moves, as will be described further below.

Therefore, the subset is a proper subset and does therefore not comprise all existing loudspeaker positions, but also, the subset comprises four or more loudspeaker positions.

Figure 4:
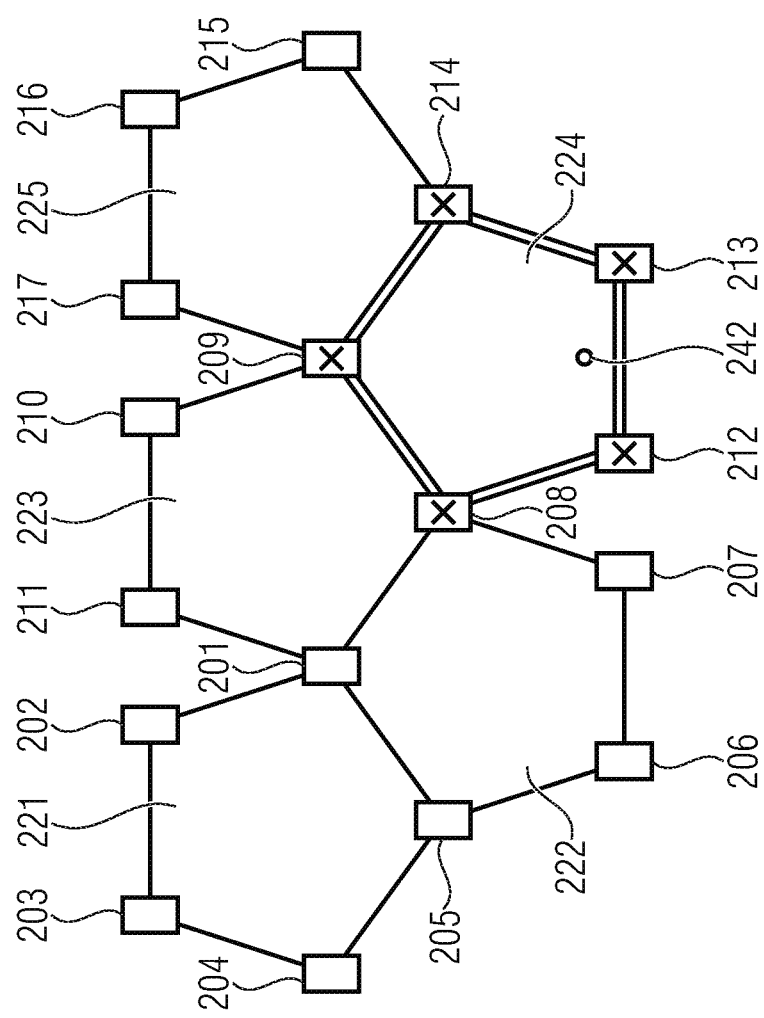
FIG. 4 illustrates another example for a determination of a proper subset of loudspeaker positions according to an embodiment dependent on a second panning position.
Figure 5:
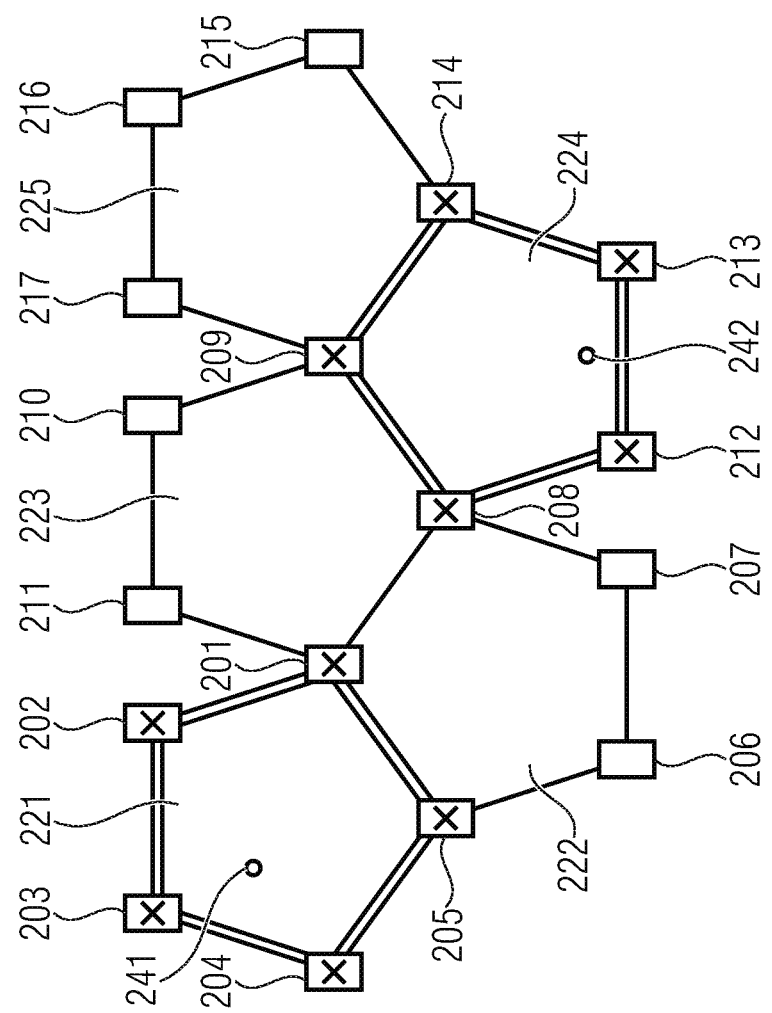
FIG. 5 illustrates the determination of two proper subsets of loudspeaker positions according to an embodiment depending on the first and the second panning position.
Figure 6:
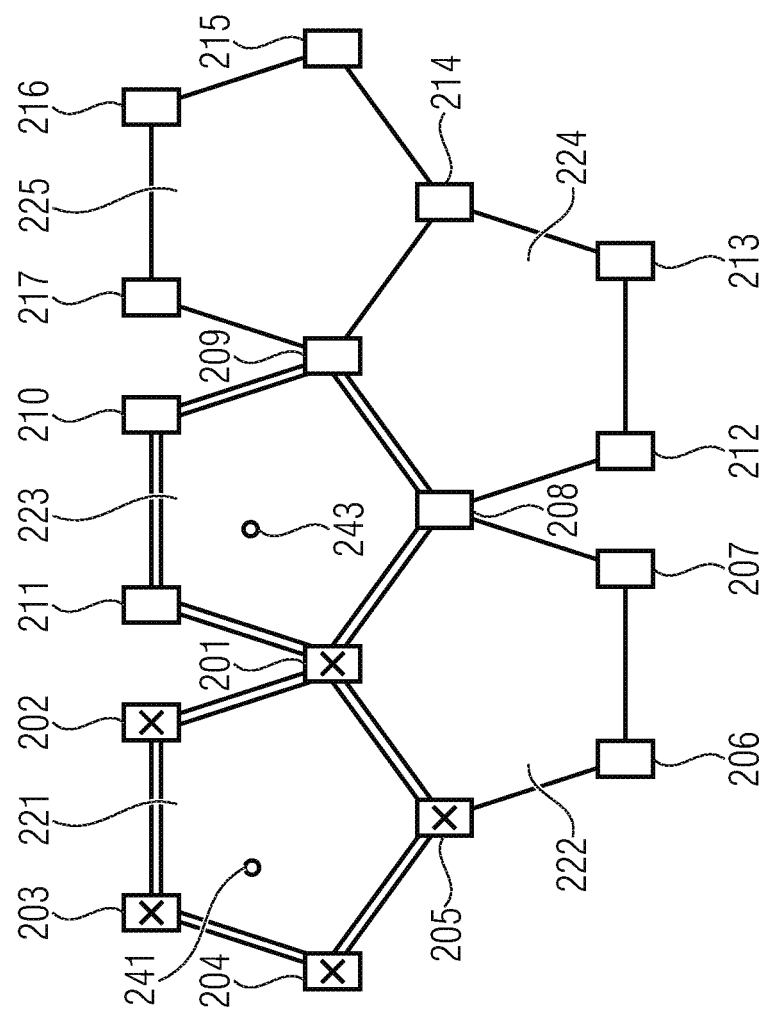
FIG. 6 illustrates the determination of two proper subsets of loudspeaker positions according to an embodiment depending on the first and a third panning position.

FIG. 4 again illustrates the 17 loudspeakers at the 17 loudspeaker positions 201-217. In FIG. 4, a new panning position is located at position 242. The new panning position 242 of FIG. 4 is different from the old panning position 241 of FIG. 3. The reason for this, may for example be, that in the recording scene, a person which emits sound waves causing the audio input signal may have moved, so that at a later point in time, the panning position also moves from position 241 to position 242.

Or, panning position 242 may relate to the same point-in-time but to a further audio input signal. For example, the panning position 241 may relate to a first audio input signal which may comprise the sound part of a violin in an orchestra. The panning position 242 may relate to a second audio input signal which may comprise the sound port of a trumpet in the orchestra. Then, in the reproduction scene, panning position 241 indicates that the violin shall be virtually positioned at panning position 241, and the panning position 242 indicates that the trumpet shall be virtually positioned at panning position 242. Thus, in an embodiment, the audio input signal relating to the violin is only reproduced by the loudspeakers at loudspeaker positions 201, 202, 203, 204 and 205 and the further audio input signal relating to the trumpet is only reproduced by the loudspeakers at loudspeaker positions 208, 212, 213, 214 and 209 (see FIG. 5). Thus, according to an embodiment, panning gains for amplifying or attenuating the audio input signal representing the sounds from the violin are only calculated for the loudspeakers at loudspeaker positions 201, 202, 203, 204 and 205. And gains for amplifying or attenuating the further audio input signal representing the sounds from the trumpet are only calculated for the loudspeakers at loudspeaker positions 208, 212, 213, 214 and 209.

In this example, referring to the audio input signal representing the violin as $ais_1$ and referring to the audio input signal representing the trumpet as $ais_2$, then gains $g_{1,1}$, $g_{2,1}$, $g_{3,1}$, $g_{4,1}$ and $g_{5,1}$ for the loudspeakers at loudspeaker positions 201, 202, 203, 204 and 205, respectively, are calculated by the panning gain determiner 110, and the signal processor 120 applies the calculated panning gains $g_{1,1}$, $g_{2,1}$, $g_{3,1}$, $g_{4,1}$ and $g_{5,1}$ on the audio input signal $ais_1$ to obtain the audio output signals $aos_1$, $aos_2$, $aos_3$, $aos_4$ and $aos_5$ for the loudspeakers at the loudspeaker positions 201, 202, 203, 204 and 205, respectively, for example, according to:

$$aos_1 = g_{1,1} \cdot ais_1$$

$$aos_2 = g_{2,1} \cdot ais_1$$

$$aos_3 = g_{3,1} \cdot ais_1$$

$$aos_4 = g_{4,1} \cdot ais_1$$

$$aos_5 = g_{5,1} \cdot ais_1$$

Likewise, gains $g_{8,2}$, $g_{12,2}$, $g_{13,2}$, $g_{14,2}$ and $g_{9,2}$ for the loudspeakers at loudspeaker positions 208, 212, 213, 214 and 209, respectively, are calculated by the panning gain determiner 110, and the signal processor 120 applies the calculated panning gains $g_{8,2}$, $g_{12,2}$, $g_{13,2}$, $g_{14,2}$ and $g_{9,2}$ on the audio input signal $ais_2$ to obtain the audio output signals $aos_8$, $aos_{12}$, $aos_{13}$, $aos_{14}$ and $aos_9$ for the loudspeakers at the loudspeaker positions 208, 212, 213, 214 and 209, respectively, for example, according to:

$$aos_8 = g_{8,2} \cdot ais_2$$

$$aos_{12} = g_{12,2} \cdot ais_2$$

$$aos_{13} = g_{13,2} \cdot ais_2$$

$$aos_{14} = g_{14,2} \cdot ais_2$$

$$aos_9 = g_{9,2} \cdot ais_2$$

In particular, according to an embodiment, the audio input signal comprises a plurality of audio input samples. The signal processor 120 may, e.g., be configured to generate each audio output signal of the four or more audio output signals by multiplying each of one or more of the audio input samples of the audio input signal with the panning gain for said audio output signal to obtain one or more audio output samples of the audio output signal.

Or, in another embodiment, the audio input signal comprises a plurality of audio input samples, and the signal processor 120 is configured to generate each audio output signal of the four or more audio output signals by multiplying each of one or more of the audio input samples of the audio input signal with a square root of the panning gain for said audio output signal to obtain one or more audio output samples of the audio output signal.

In some cases, more than one audio output signal shall be reproduced by the same loudspeaker. For example, in FIG. 6, the panning position 243 relating to an audio input signal $ais_3$ is located within a pentagon defined by the polygon with the vertices 201, 208, 209, 210 and 211. Then, panning gains $g_{1,3}$, $g_{8,3}$, $g_{9,3}$, $g_{10,3}$ and $g_{11,3}$ relating to $ais_3$ are calculated by the panning gain determiner 110, and the signal processor 120 applies the calculated panning gains $g_{1,3}$, $g_{8,3}$, $g_{9,3}$, $g_{10,3}$ and $g_{11,3}$ on the audio input signal $ais_3$. To obtain the audio output signals, the signal processor 120 may, for example, apply the following formulas:

$$aos_1 = g_{1,1} \cdot ais_1 + g_{1,3} \cdot ais_3$$

$$aos_2 = g_{2,1} \cdot ais_1$$

$$aos_3 = g_{3,1} \cdot ais_1$$

$$aos_4 = g_{4,1} \cdot ais_1$$

$$aos_5 = g_{5,1} \cdot ais_1$$

$$aos_8 = g_{8,3} \cdot ais_3$$

$$aos_9 = g_{9,3} \cdot ais_3$$

$$aos_{10} = g_{10,3} \cdot ais_3$$

$$aos_{11} = g_{11,3} \cdot ais_3$$

In more general, if an audio output signal shall reproduce portions of more than one audio input signal, the signal processor 120 may, e.g., be configured to obtain such an audio output signal by applying the respective gains on the respective audio input signals and by combining the respectively amplified or attenuated audio input signals. For example, in FIG. 1, the calculated panning gain $g_{1,1}$ is applied on $ais_1$ to obtain the amplified or attenuated $g_{1,1} \cdot ais_1$, and the calculated panning gain $g_{1,3}$ is applied on $ais_3$ to obtain the amplified or attenuated $g_{1,3} \cdot ais_3$. Then $g_{1,1} \cdot ais_1$ and $g_{1,3} \cdot ais_3$ are combined.

Thus, the provided concepts can be applied to more than one audio input signal. Correspondingly, according to an embodiment, the audio input signal may, e.g., be a first audio input signal, wherein the panning position is a first panning position, wherein the panning gain is a first input-signal-dependent panning gain, and wherein the proper subset is a first proper subset.

The panning gain determiner 110 may, e.g., be configured to determine one or more further proper subsets from a set of five or more loudspeaker positions, so that each of the one or more further proper subsets comprises four or more of the five or more loudspeaker positions. Moreover, the panning gain determiner 110 may, e.g., be configured to determine each of the one or more further proper subsets depending on one of one or more further panning positions and depending on the five or more loudspeaker positions, Moreover, the panning gain determiner 110 may, e.g., be configured to determine one or more further input-signal-dependent panning gains for each of the four or more audio output signals by determining each of the one or more further panning gains depending on one of the one or more further panning positions and depending on the four or more loudspeaker positions of one of the one or more further proper subsets. The signal processor 120 may, e.g., be configured to generate each audio output signal of the four or more audio output signals depending on the first input-signal-dependent panning gain for said audio output signal, depending on the one or more further input-signal-dependent panning gains for said audio output signal, depending on the audio input signal, and depending on the one or more further audio input signals.

As a side remark, it is mentioned, that in the following, the panning position is sometimes also called a panning direction. The term panning direction originates from that for example, in an azimuth, elevation coordinate system, the panning position in the two-dimensional coordinate system is, in the real three-dimensional setup a direction information pointing from a central point, e.g., from a sweet spot to the direction of the loudspeaker.

In the following, another aspect of embodiments is described. This aspect relates to how panning is realized between the loudspeaker positions of the determined subset, for example between the loudspeaker positions 208, 212, 213, 214 and 209 of FIGS. 4 and 5.

However, it should be noted that according to some embodiments, no preselection of a subset takes place. Instead, for example, audio output signals are generated for the loudspeakers at all loudspeaker positions 208, 212, 213, 214 and 209 to simulate that an audio output signal, for example an audio output signal ais2 originates from a panning position, e.g., a panning position 242. Also, such embodiments are covered.

Figure 7:
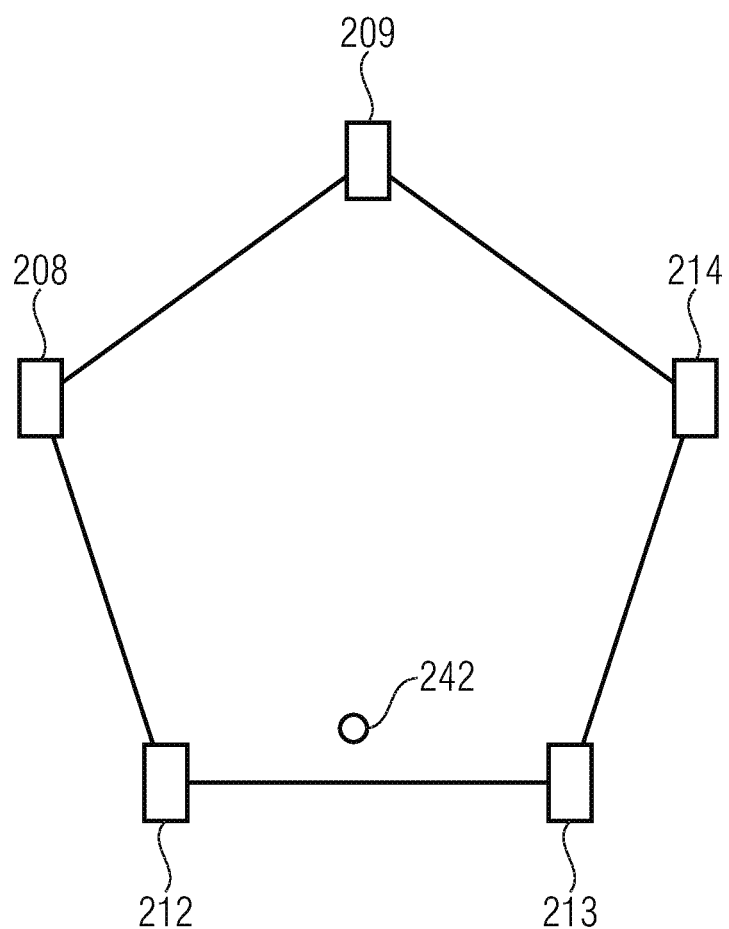
FIG. 7 illustrates five loudspeaker positions and a panning position.
Figure 8:
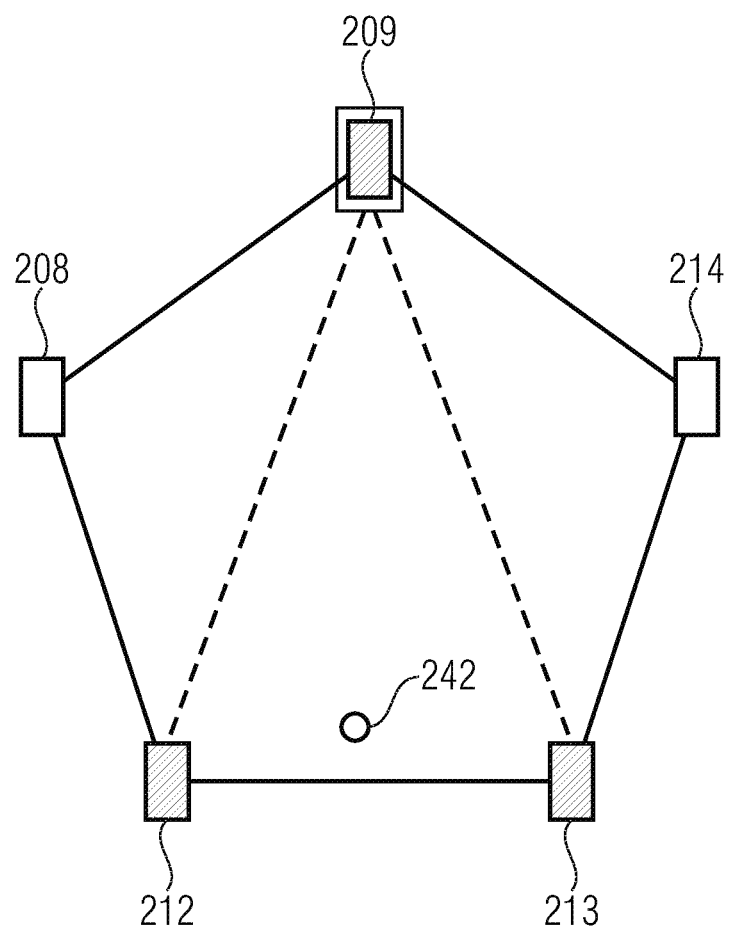
FIG. 8 illustrates a first triangle-subdivision of a polygon defined body dependent on a first loudspeaker position according to an embodiment.

FIG. 7 illustrates the setup, showing the 5 loudspeaker positions 208, 212, 213, 214 and 209 of the loudspeakers and the panning position 242. According to embodiments, to determine the panning gains for the to obtain audio output signals to be output at the loudspeaker positions 208, 212, 213, 214 and 209, the following concepts are applied:

FIG. 8 illustrates panning gain determination for the audio output signal for loudspeaker position 209. The body enclosed by the polygon with the vertices 208, 212, 213, 214 and 209 is subdivided into three triangles, namely a first triangle with vertices 209, 208, 212, a second triangle with vertices 209, 212, 213, and a third triangle with vertices 209, 213, 214, so that the subdivision of the body resulted in triangles that have loudspeaker position 209 (for which the panning gain is determined) as vertex.

As the panning position is comprised by the second triangle with the vertices 209, 212, 213, according to embodiments, the panning gain for the audio output signal for loudspeaker position 209 is then calculated depending on loudspeaker positions 209, 212, 213, and not by the remaining loudspeaker positions 208 and 214. This simplifies computation and helps to save processor time compared to using all loudspeaker positions when calculating the panning gain associated with the audio output signal to be generated for loudspeaker position 209.

Thus, by subdividing the body enclosed by the polygon, the panning gain determiner has determined a group of associated loudspeaker positions comprising the loudspeaker positions 209, 212, 213, wherein the group of associated loudspeaker positions is associated the audio output signal for the loudspeaker at loudspeaker position 209 and determines which of the loudspeaker positions are taken into account when calculating the panning gain to obtain the output signal for (associated with) the loudspeaker position 209.

Vice versa, the group of associated loudspeaker signals defines a triangle that is group-specific for the group of associated loudspeaker signals. In more general, the triangle 209, 212, 213 can be considered as a group-specific polygon with the vertices 209, 212, 213.

Figure 9:
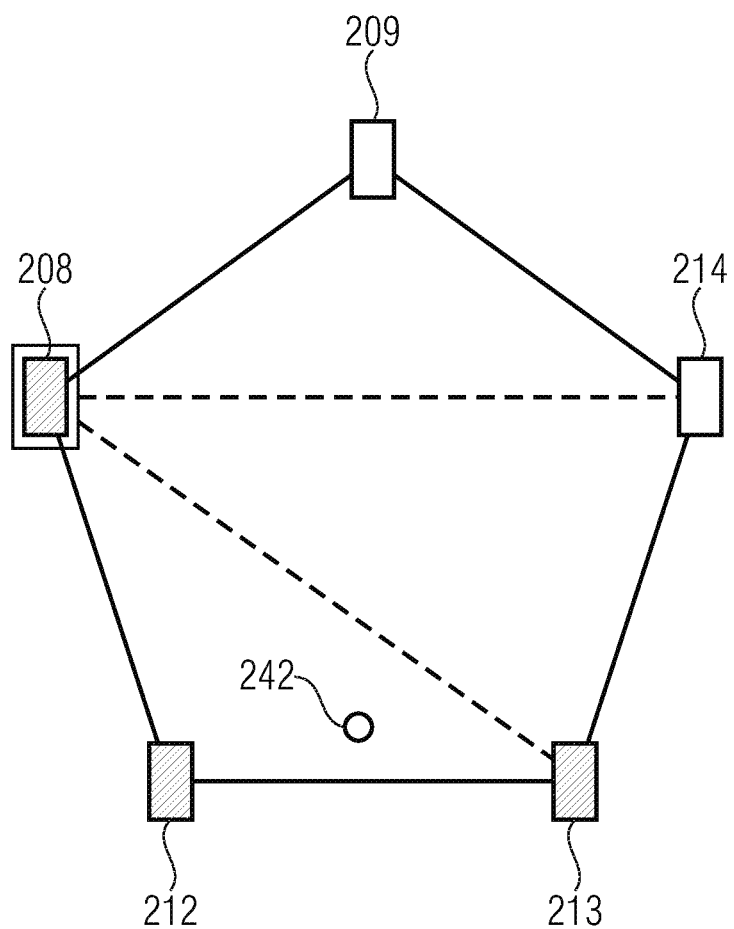
FIG. 9 illustrates a second triangle-subdivision of the polygon defined body dependent on a second loudspeaker position according to an embodiment.

Likewise, FIG. 9 illustrates panning gain determination for the audio output signal for loudspeaker position 208. The body enclosed by the polygon with the vertices 208, 212, 213, 214 and 209 is subdivided into three triangles, namely a first triangle with vertices 208, 212, 213, a second triangle with vertices 208, 213, 214, and a third triangle with vertices 208, 214, 209, so that the subdivision of the body resulted in triangles that have loudspeaker position 209 (for which the panning gain is determined) as vertex. As the panning position is comprised by the first triangle with the vertices 208, 212, 213, according to embodiments, the panning gain for the audio output signal for loudspeaker position 208 is then calculated depending on loudspeaker positions 208, 212, 213, and not by the remaining loudspeaker positions 209 and 214. Thus, by subdividing the body enclosed by the polygon, the panning gain determiner has determined a group of associated loudspeaker positions comprising the loudspeaker positions 208, 212, 213, wherein the group of associated loudspeaker positions is associated the audio output signal for the loudspeaker at loudspeaker position 208.

Figure 10:
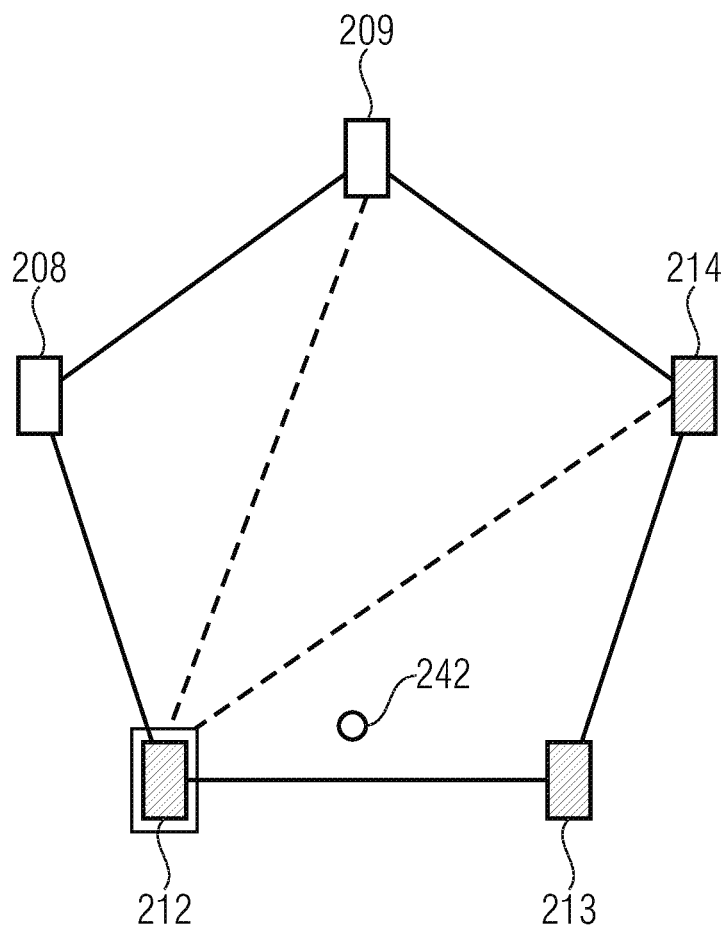
FIG. 10 illustrates a third triangle-subdivision of the polygon defined body dependent on a third loudspeaker position according to an embodiment.

Similarly, FIG. 10 illustrates that the group of associated loudspeaker positions, being associated with the audio output signal for the loudspeaker at loudspeaker position 212, comprises the loudspeaker positions 212, 213, 214 and the panning gain to obtain said audio output signal is calculated depending on these loudspeaker positions 212, 213, 214.

Figure 11:
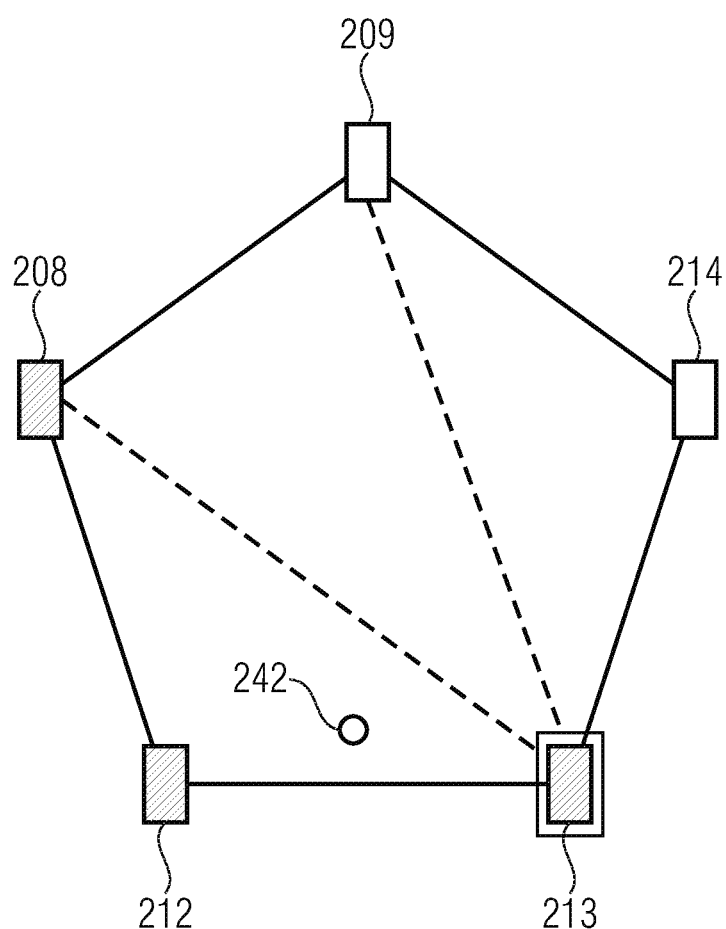
FIG. 11 illustrates a fourth triangle-subdivision of the polygon defined body dependent on a fourth loudspeaker position according to an embodiment.

Likewise, FIG. 11 illustrates that the group of associated loudspeaker positions, being associated with the audio output signal for the loudspeaker at loudspeaker position 213, comprises the loudspeaker positions 213, 208, 212 and the panning gain to obtain said audio output signal is calculated depending on these loudspeaker positions 213, 208, 212.

Figure 12:
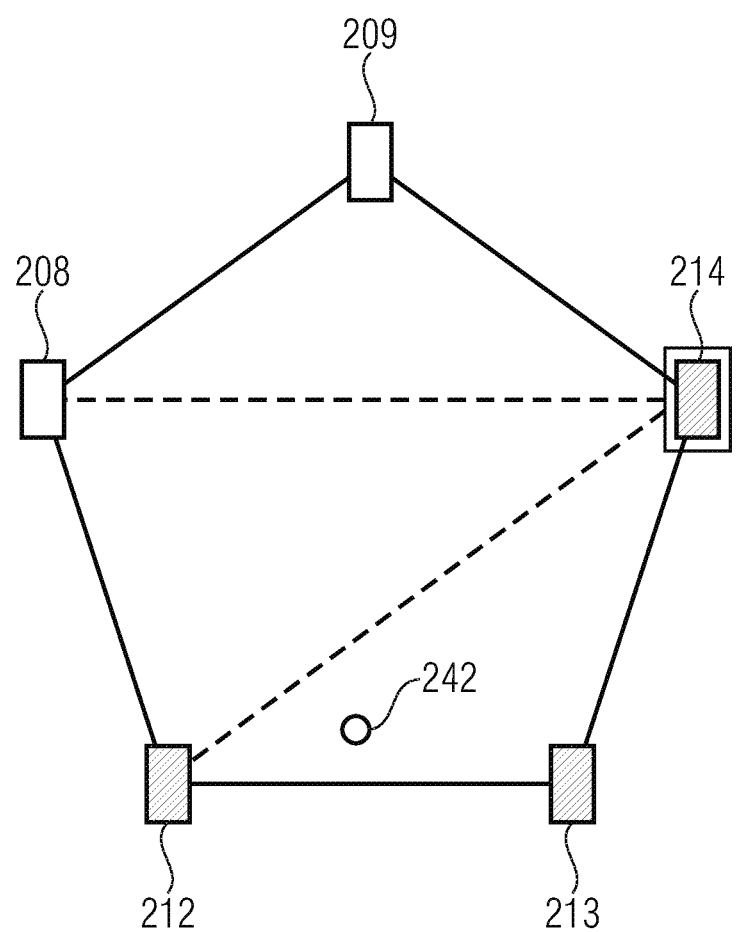
FIG. 12 illustrates a fifth triangle-subdivision of the polygon defined body dependent on a fifth loudspeaker position according to an embodiment.

Similarly, FIG. 12 illustrates that the group of associated loudspeaker positions, being associated with the audio output signal for the loudspeaker at loudspeaker position 214, comprises the loudspeaker positions 214, 212, 213 and the panning gain to obtain said audio output signal is calculated depending on these loudspeaker positions 214, 212, 213.

According to embodiments, the triangle that encloses the panning position defines the group of associated loudspeaker positions.

If the panning position is exactly located on an edge of two of the triangles, some embodiments, for example, choose one of the two triangles for calculating the panning gain. Other embodiments, for example, calculate a first intermediate panning gain for a first one of the two triangles and further calculate a second intermediate panning gain for a second one of the two triangles, and then calculate the average of the first and the second intermediate panning gain as the final panning gain.

For subdividing the body defined by the polygon, (here the polygon with the edges 208, 212, 213, 214, 209, which here defines a pentagon) it is of advantage that the body is convex.

Moreover, it is of advantage that the body defined by the polygon is subdivided into triangles, such that a triangle does not enclose loudspeaker positions different from the loudspeaker positions that define the vertices of the triangle.

According to some embodiments, the polygon with the loudspeaker positions as vertices, does not define a pentagon, but defines any other kind of body with four or more vertices, for example, a quad, a hexagon, etc.

Figure 13:
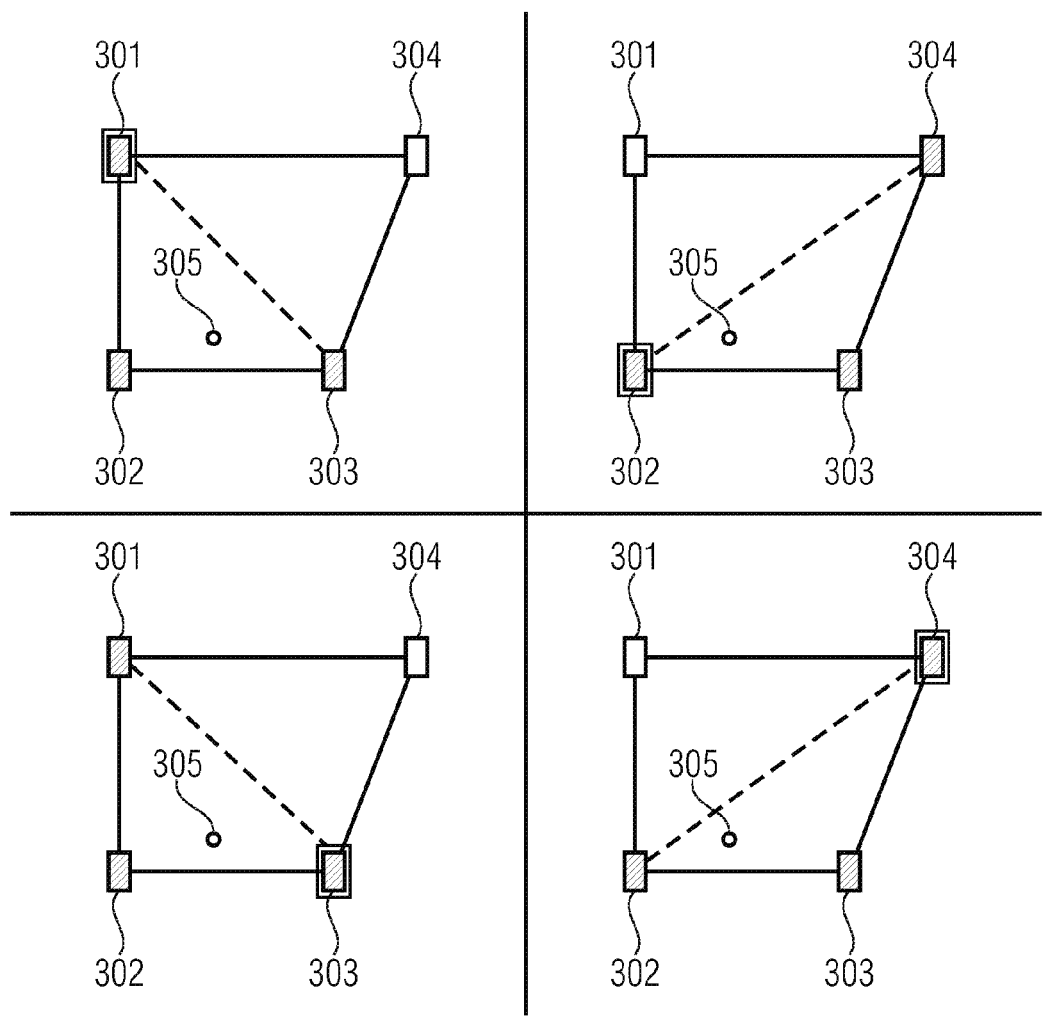
FIG. 13 illustrates triangle-subdivisions of another polygon-defined according to an embodiment, wherein the polygon-defined body is a quad.

FIG. 13 illustrates the subdivision of a quad for the audio output signals for loudspeakers at each of the loudspeaker positions 301, 302, 303, 304 and for a panning position 305.

Figure 14:
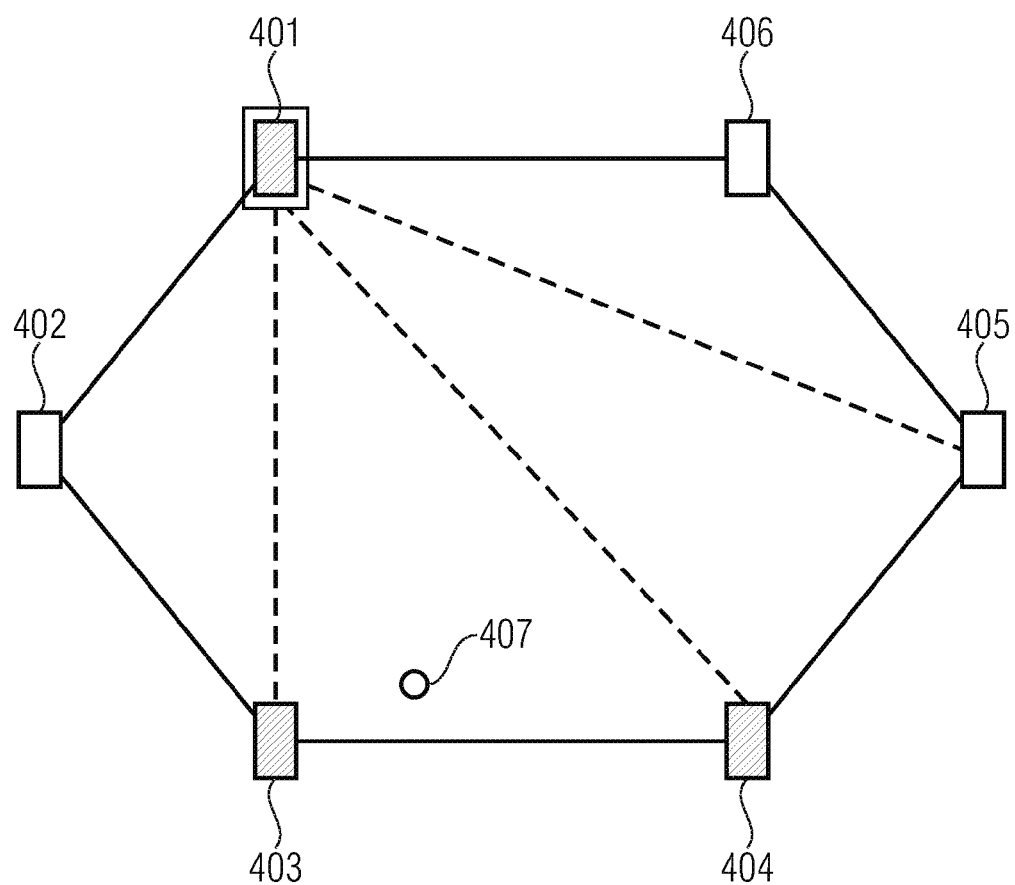
FIG. 14 illustrates a triangle-subdivision of a further polygon-defined according to an embodiment, wherein the polygon-defined body is a hexagon.

FIG. 14 illustrates the subdivision of a hexagon with vertices 401, 402, 403, 404, 405, 406 for the audio output signal for the loudspeaker at the loudspeaker position 401 and for a panning position 407. The group of associated loudspeaker positions for the audio output signal for the loudspeaker at the loudspeaker position 401 comprises the loudspeaker positions 401, 403 and 404.

Figure 15:
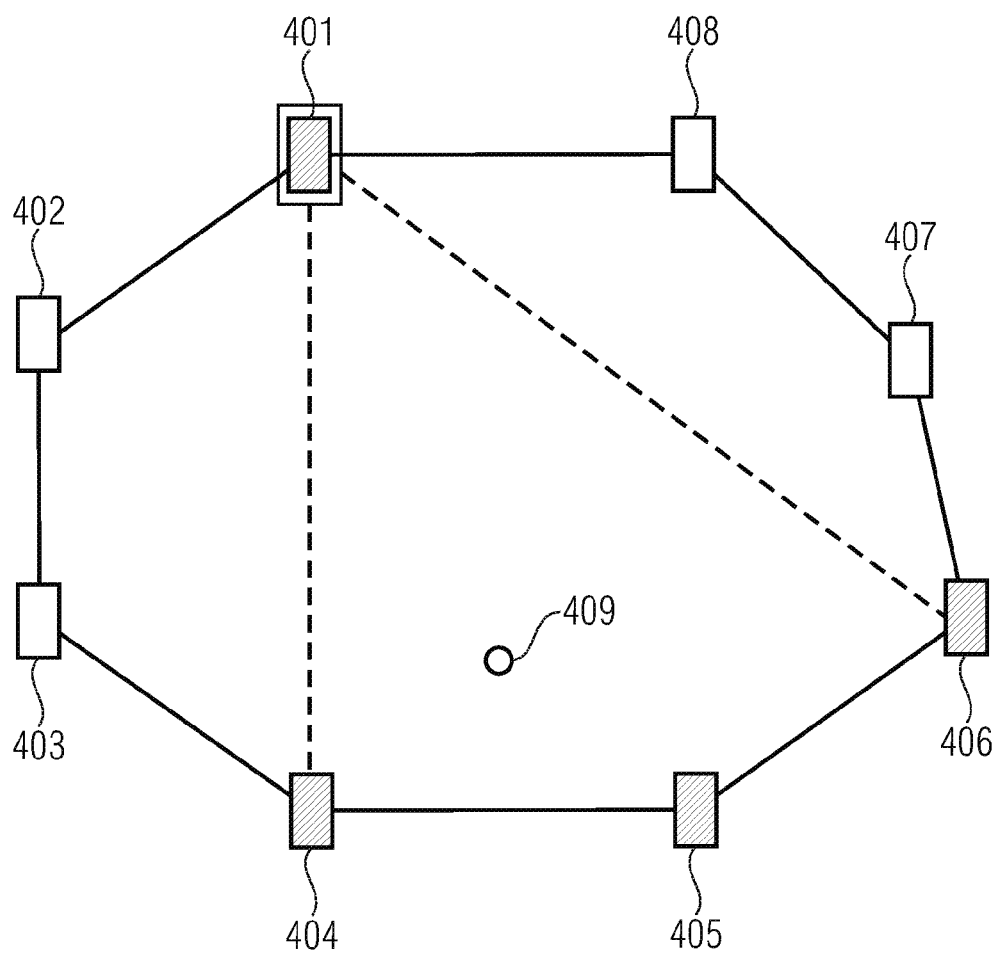
FIG. 15 illustrates a subdivision of a further polygon-defined according to an embodiment, wherein the polygon-defined body is a octagon, which is subdivided into quads.

The sub-bodies in which the body defined by the polygon is subdivided do not have to be triangles. FIG. 15 illustrates an example according to an embodiment, wherein the octagon with the vertices 501, 502, 503, 504, 505, 506, 507 and 508 is subdivided into three quads, when the group of associated loudspeaker positions for the audio output signal for loudspeaker position 501 shall be determined, namely a first quad with the vertices 401, 402, 403 and 404, a second quad with the vertices 401, 404, 405 and 406 and a third quad with the vertices 401, 406, 407, 408. As panning position 409 is enclosed by the quad 401, 404 405, 406, the panning gain determiner calculates the panning gain associated with loudspeaker position 401 dependent on the panning position 409, and depending on the loudspeaker positions 401, 404, 405, 406 of the group of associated loudspeaker positions for the audio output signal for loudspeaker position 401.

In general the panning gain determiner 110 is configured to determine a group-specific polygon which encloses the panning position. Such a polygon is group specific for the group of associated loudspeaker signals.

These concepts are based on the finding that complexity is reduced when less than all loudspeaker positions are taken into account.

Moreover, these concepts are based on the finding, that by determining a gain factor for each audio output signal for each of the loudspeaker positions creates a more realistic sound impression compared to only determining gain factors and thus audio output signals for the loudspeaker positions of a single triangle. Instead, embodiments determine gain factors for each loudspeaker position of the subset, although by only taking for each of the gain factors the loudspeaker positions of a gain-factor-specific triangle into account.

However, as the corresponding triangles (or, more generally: sub-bodies) for determining the panning gains for the audio output signals differ for at least some of the audio output signals, this ensures, that all loudspeaker positions are taken into account for determining at least one of the gain factors. This is advantageous compared to taking the same triangle into account for determining all panning gains.

In the following, another aspect of the invention is described. Here, it is explained, how the panning gain for an audio output signal for a loudspeaker at a loudspeaker position may, for example, be determined depending on the panning position and depending on the loudspeaker positions of the group of associated loudspeaker positions.

Figure 16:
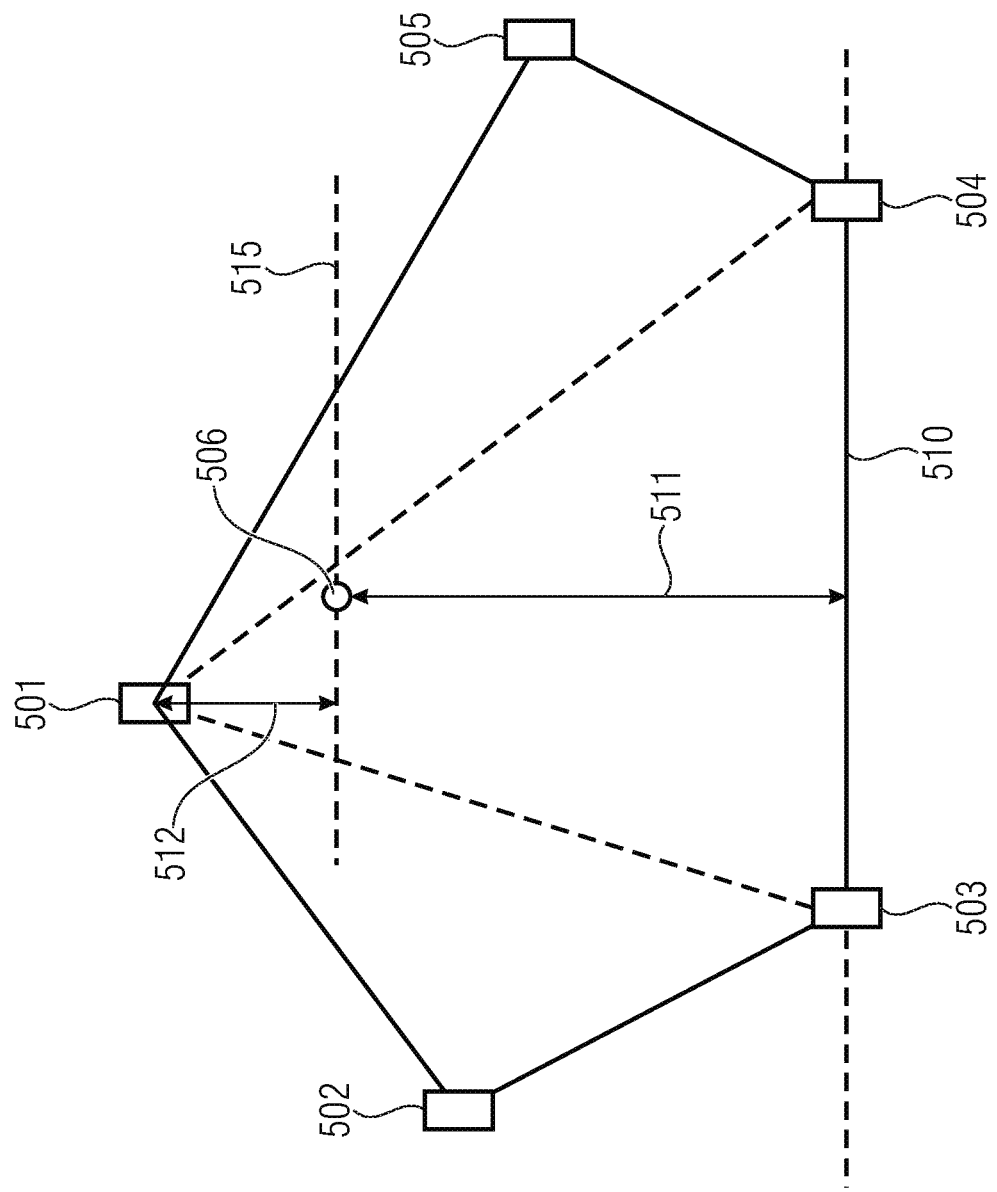
FIG. 16 illustrates a determination of a panning gain based on distances according to an embodiment.

FIG. 16 illustrates a corresponding example showing the loudspeaker positions 501, 502, 503, 504, 505 and panning position 506. As the panning position 506 is located within the triangle of the loudspeaker positions 501, 503 and 504, only the loudspeaker positions 501, 503 and 504 belong to the group of associated loudspeaker positions, and only these loudspeaker positions 501, 503, 504 are taken into account for determining the panning gain for the audio output signal for loudspeaker position 501 (and not the loudspeaker positions 502 and 505, which do not belong to this group of associated loudspeaker signals).

Line 511 indicates a first distance being a shortest distance between the panning position 507 and a first straight line through the two further loudspeaker positions 503, 504 of the group of associated loudspeaker positions.

Line 512 indicates a second distance being a shortest distance between the loudspeaker position 501 (for the audio output signal of which, the panning gain is determined) and a second straight line 515 through the panning position, wherein said second straight line is parallel to said first straight line 510.

The panning gain determiner 110 may, for example, be configured to determine the panning gain depending of the ratio of the first distance 511 and a sum of the first distance 511 and the second distance 512.

For example, assuming that in FIG. 16 the first distance 511 is 0.6 and the second distance 512 is 0.2, then, the panning gain $p_{501}$ may, e.g., be calculated to be $$p_{501} = \frac{0.6}{0.6 + 0.2} = \frac{0.6}{0.8} = 0.75$$

This reflects that the loudspeaker position 501 is closer to the line 515 than loudspeaker positions 503 and 504 and thus, the panning gain $p_{501}$ is closer to 1 than to 0.

Figure 17:
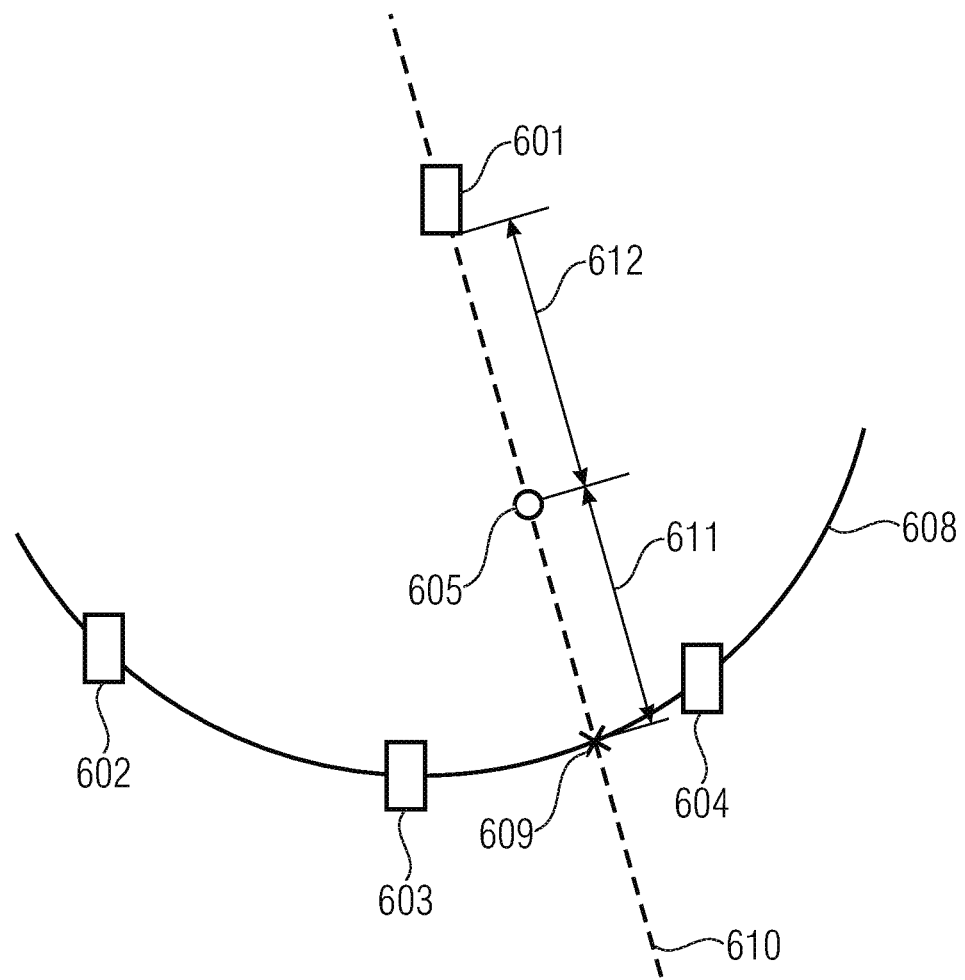
FIG. 17 illustrates a determination of a panning gain based on distances according to another embodiment.

FIG. 17 illustrates another embodiment, wherein the group of associated loudspeaker positions comprises four loudspeaker positions 601, 602, 603 and 604. The panning position is indicated by 605. The panning gain for the audio output signal for loudspeaker position 601 shall be determined. Mathematical concepts of the state of the art may be employed to determine a curve 608 through the loudspeaker positions 602, 603, 604. In FIG. 17, a dashed straight line 610 through loudspeaker position 601 and panning position 605 is illustrated. The intersection of the dashed straight line 610 and curve 608 defines intersection point 609. A first distance 611 is defined by the distance between panning position 605 and intersection point 609. A second distance 612 is defined by the distance between panning position 605 and loudspeaker position 601.

Again, the panning gain determiner 110 may, for example, be configured to determine the panning gain depending of the ratio of the first distance 511 and a sum of the first distance 511 and the second distance 512.

Assuming that in FIG. 17, the first distance 611 is 0.25 and that the second distance 612 is 0.3, the panning gain may, e.g., be $$p_{601} = \frac{0.25}{0.25 + 0.3} = \frac{0.25}{0.55} = 0.455$$

The panning gain $p_{601}$ is slightly below 0.5 and this reflects that the loudspeaker position 601 is slightly farer away from the panning position 605 than the intersection point 609.

As already mentioned, in some embodiments, no group of associated loudspeaker positions for determining each of the panning gains is determined. Instead, all loudspeaker positions of the proper subset are taken into account for calculating each gain.

In such an embodiment, each loudspeaker position of the four or more loudspeaker positions of the proper subset is associated with exactly one of the four or more audio output signals, and wherein each of the four or more audio output signals is associated with exactly one of the four or more loudspeaker positions of the proper subset. The panning gain determiner 110 may, e.g., be configured to calculate, for each audio output signal of the four or more audio output signals, the panning gain for said audio output signal depending on a panning position and depending on the loudspeaker position of each of the four or more audio output signals.

Different panning gains may, e.g., be determined for different points-in-time. According to such embodiments, the panning gain determiner 110 may, e.g., be configured to determine the panning gain for each audio output signal of the four or more audio output signals for a first point in time as a first time-dependent panning gain for said audio output signal. Moreover, the panning gain determiner 110 may, e.g., be configured to determine a further panning gain for each audio output signal of the four or more audio output signals for a different second point in time as a second time-dependent panning gain for said audio output signal, said second time-dependent panning gain being different from the first time-dependent panning gain for said audio output signal.

Moreover, different panning gains may, e.g., be determined for different frequencies. According to such embodiments, the panning gain determiner 110 may, e.g., be configured to determine the panning gain for each audio output signal of the four or more audio output signals for a first frequency as a first frequency-dependent panning gain for said audio output signal. Moreover, the panning gain determiner 110 may, e.g., be configured to determine a further panning gain for each audio output signal of the four or more audio output signals for a different second frequency as a second frequency-dependent panning gain for said audio output signal, said second frequency-dependent panning gain being different from the first frequency-dependent panning gain for said audio output signal.

Figure 18:
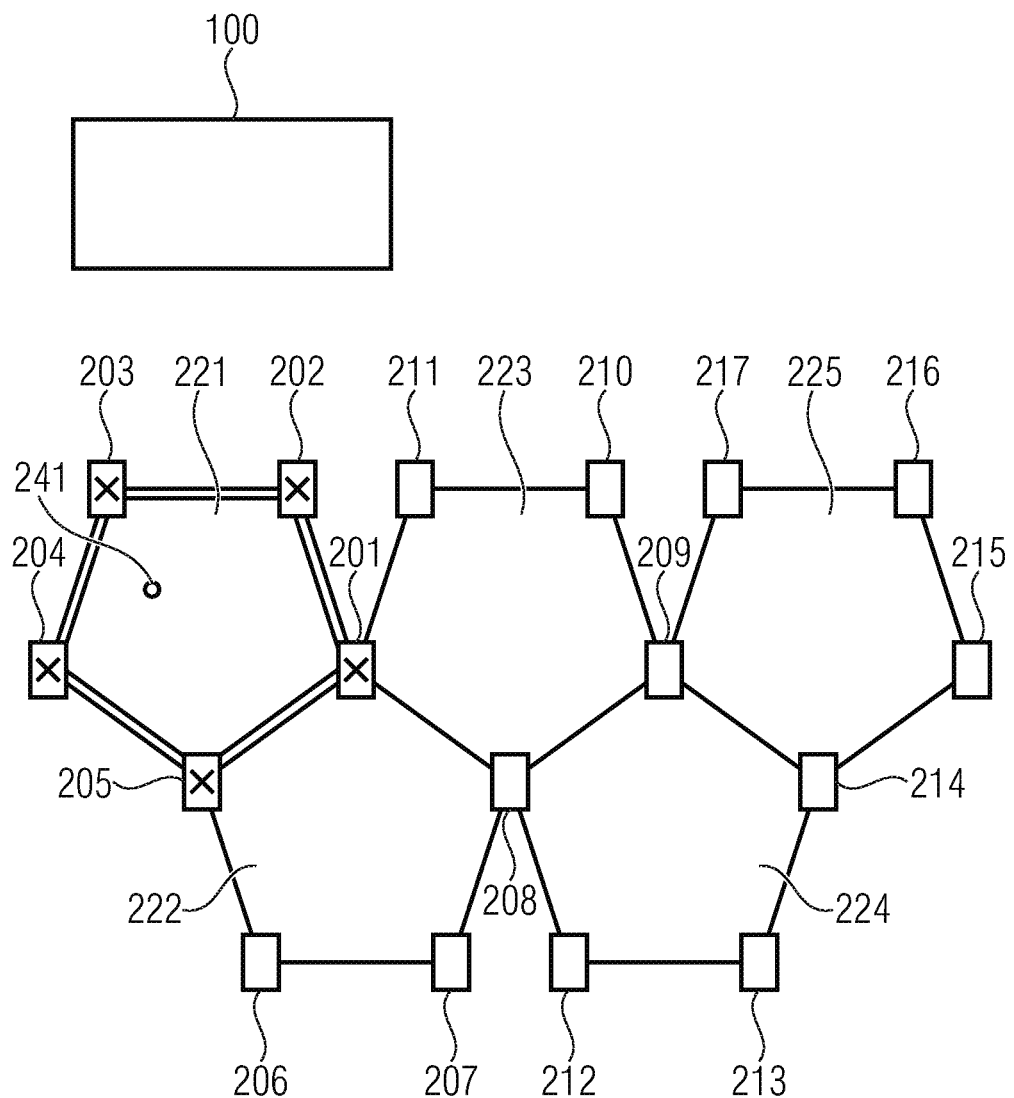
FIG. 18 illustrates a system according to an embodiment.
Figure 19:
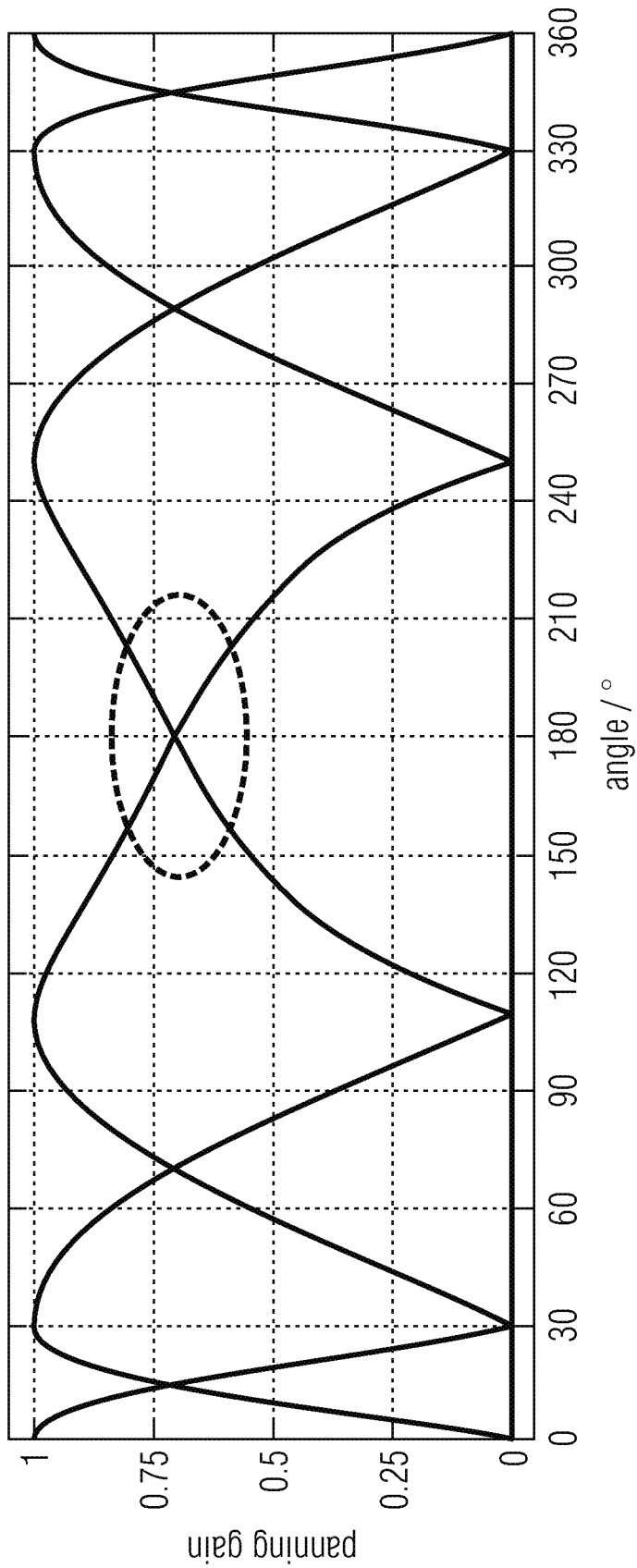
FIG. 19 illustrates the VBAP panning gains for a common 5.1 surround setup.
Figure 20:
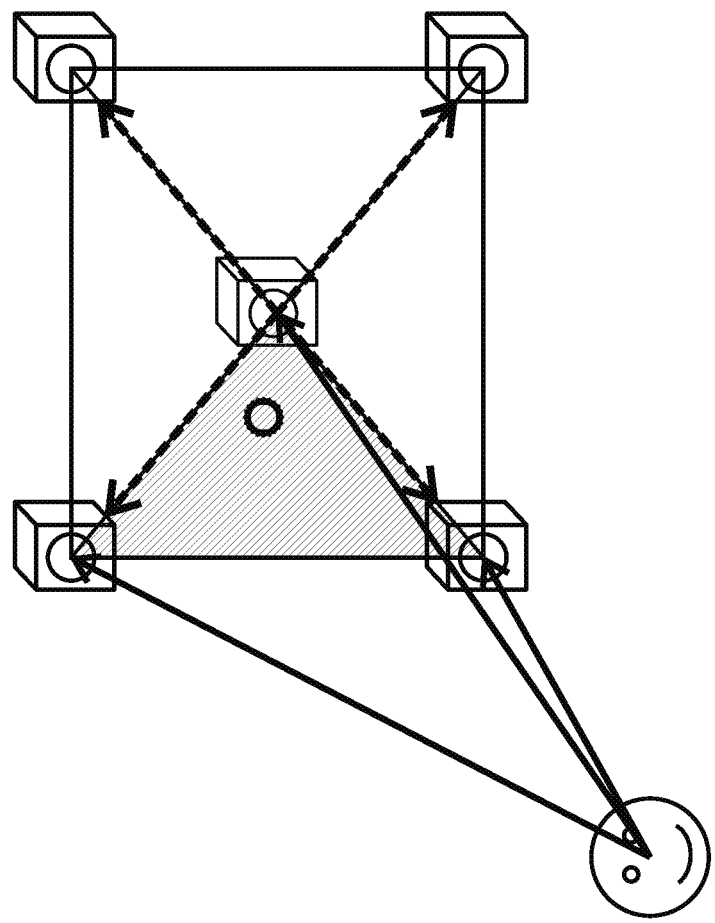
FIG. 20 depicts a generalized VBAP method using an imaginary loudspeaker and a downmix.

FIG. 18 illustrates a system according to an embodiment. The system comprises five or more loudspeakers, and an apparatus as described above with reference to FIG. 1. The apparatus is indicated by reference sign 100. Furthermore, the system of FIG. 18 comprises 17 loudspeakers at the loudspeaker positions 201-217.

Each of the loudspeakers is associated with exactly one loudspeaker position 201-217 of the set of five or more loudspeaker positions.

Each of the four or more audio output signals is associated with exactly one loudspeaker position of the loudspeaker positions 201-217 of the proper subset. Moreover, each of the four or more audio output signals is associated with exactly one of the loudspeaker positions 201-217 of the proper subset.

The system is configured to output each audio output signal of the four or more audio output signals by the loudspeaker which is associated with the same loudspeaker position as said audio output signal.

In an embodiment, the system may, e.g., be configured to output none of the four or more audio output signals by any of the four or more loudspeakers not being associated with the same loudspeaker position as said audio output signal.

According to an embodiment, the system may, e.g., be configured to not output any of the four or more loudspeaker signals by at least one of the five or more loudspeakers.

As already mentioned above, not all embodiments necessitate that the panning gain determiner 110 conducts a pre-selection of a proper subset of loudspeaker positions, as described with reference to FIGS. 3-6.

In such embodiments, each loudspeaker position of four or more loudspeaker positions is associated with exactly one of the four or more audio output signals, and wherein each of the four or more audio output signals is associated with exactly one of the four or more loudspeaker positions.

Moreover, in such embodiments, the panning gain determiner 110 of the apparatus of FIG. 1 is configured to determine, for each audio output signal of the four or more audio output signals, a group of associated loudspeaker positions, being associated with said audio output signal, depending on the loudspeaker position of each of the four or more audio output signals and depending on the panning position, so that said group of associated loudspeaker positions comprises the loudspeaker position being associated with said audio output signal and at least two further loudspeaker positions of the four or more loudspeaker positions, wherein at least one of the four or more loudspeaker positions is not comprised by said group of associated loudspeaker positions.

Moreover, in such embodiments, the panning gain determiner 110 is configured to calculate, for each audio output signal of the four or more audio output signals, the panning gain for said audio output signal depending on the panning position and depending on the loudspeaker positions of the group of associated loudspeaker positions being associated with said audio output signal.

Furthermore, in such embodiments, the signal processor 120 is configured to generate each audio output signal of the four or more audio output signals depending on the panning gain for said audio output signal and depending on an audio input signal. The group of associated loudspeaker positions being associated with a first one of the four or more audio output signals is not equal to the group of associated loudspeaker positions being associated with a different second one of the four or more audio output signals.

Each of the concepts, implementations and configurations described above with reference to FIGS. 1-17 may be employed in such an apparatus.

In the following, specific embodiments of the provided polygon-based panning concepts for 3D loudspeaker setups are presented in more detail.

The provided concepts relate to 3D loudspeaker setups, as the 3D loudspeaker setup may be projected in the above-described two-dimensional coordinate system.

Embodiments provide Edge Fading Amplitude Panning (EFAP) concepts for 3D loudspeaker setups. Similar to other panning methods like Vector Base Amplitude Panning (VBAP), it can be used to create phantom sources between the loudspeaker positions. The proposed method features symmetric panning gains for symmetric loudspeaker setups, N-wise panning by using polygons instead of triangles, and a better behavior for large opening angles between loudspeakers while involving a computational complexity that is in the same order of magnitude as VBAP.

A solution would necessitate the usage of polygons instead of triangles as boundary, resulting in N-wise panning. While VBAP supports only triangles due to its fundamental principle, it can be generalized to yield N-wise panning as illustrated in FIG. 2. In doing so, an imaginary loudspeaker [1] is added in the middle of the polygon and its VBAP gain is then downmixed to its neighbors—a solution that is simpler than previously proposed solutions [2].

In surround productions, dual balance panners are widely used for positioning mono signals. For 3D productions, such a panner can easily be extended by an additional slider that adds height information. However, controlling the object's direction in 3D space is probably more crucial than controlling the source extension or auditory source width. Hence, using a dual balance panner for controlling the azimuth and the elevation angle of an object in combination with a slider for automating the source extension, is a worthwhile alternative. If such a user interface is employed, then the vector arithmetic of VBAP results in a property that is illustrated in FIG. 21.

Figure 21:
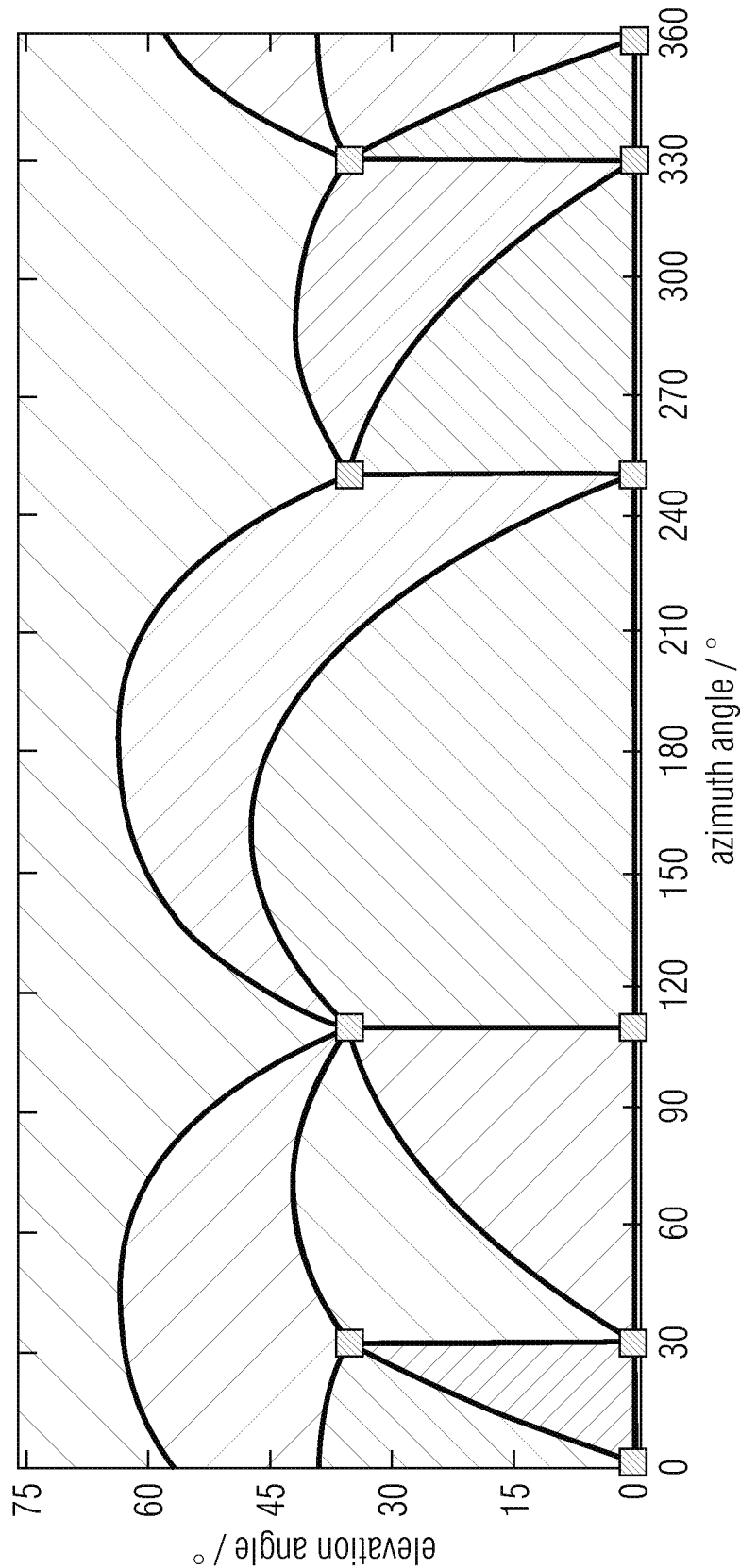
FIG. 21 illustrates VBAP triangles in spherical coordinates for a 5.1+4 setup.

FIG. 21 illustrates VBAP triangles in spherical coordinates for a 5.1+4 setup (squares: loudspeaker positions).

The squares mark the loudspeaker positions of the setup that was already used in the previous example. The solid lines result from the vectorial linear combination of the loudspeaker pairs which specify the edges of the VBAP triangles. The apparent geometric distortion of the triangles can be explained as follows: The triangles are the subdivided surfaces of the polyhedron which is defined by the loudspeakers at constant radius. By projecting the triangle edges onto the sphere surface, one yields the azimuth and the elevation angle as part of their spherical coordinates. Consequently, if the user wanted an object to be pair-wise panned between the U110 and the U-110 speaker located at 35° elevation, he would have to follow a trajectory that goes beyond 60° elevation. For a trajectory with constant elevation of 35°, VBAP would result in significant amplitudes for the M110 and M-110 loudspeaker channels.

Some of the provided embodiments aim to 1. keep an approach with reduced computation requirements (like VBAP)
2. realized as amplitude panning (like VBAP)
3. in a particular embodiment, employ power normalized gains (like VBAP)
4. realize native support for N-wise panning defined by polygons instead of triangles
5. Pairwise panning along the polygon
6. For small angles (<60°) and 2 active speakers, approximate tan-law (2D VBAP)
7. For large angles and 2 active speakers achieve sufficient level difference to avoid panning where sum localization doesn't work
8. achieve smooth transition of the gains between the involved loudspeakers 9. wherein some embodiments realize calculation directly in the spherical coordinate system (see, for example, FIG. 21).

Panning concepts are provided that conform to these requirements. 2D considerations are extended for 3D setups.

At first, 2D considerations are described.

In the 2D case, the directional parameters are reduced to the azimuth angle. While the fourth design goal is not relevant to the 2D case, the sixth and seventh are of special importance. A simple solution that features the wanted properties can be found by computing linear cross-fading gains as an intermediate result, $$g_n = 1 - \frac{\alpha_n}{\alpha_0}, \qquad (4)$$

where $\alpha_0$ denotes the opening angle between the involved loudspeaker pair and $\alpha_n$ denotes the angle between the respective loudspeaker and the panning direction.

Figure 22:
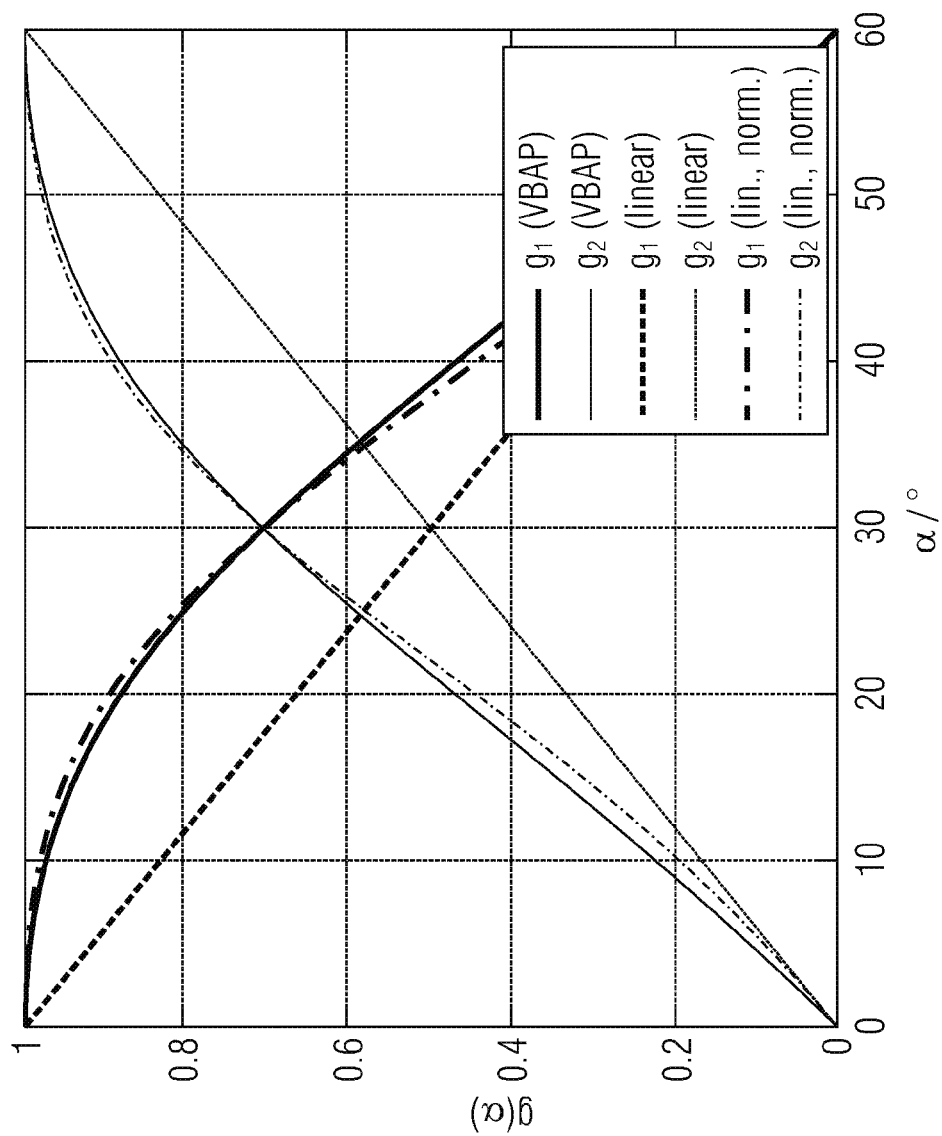
FIG. 22 illustrates panning gains for a stereo setup.

FIG. 22 illustrates panning gains for a stereo setup (solid: VBAP; dotted: linear cross-fading; dashed: power normalized cross-fading). In particular, FIG. 22 depicts for an opening angle of 60° these cross-fading functions and the target curves which are given by the 2D VBAP panning gains.

If in a second step the energy normalization (3) is applied to the linear cross-fading gains, like for VBAP, one can observe that the result closely approximates the given target curves.

Figure 23:
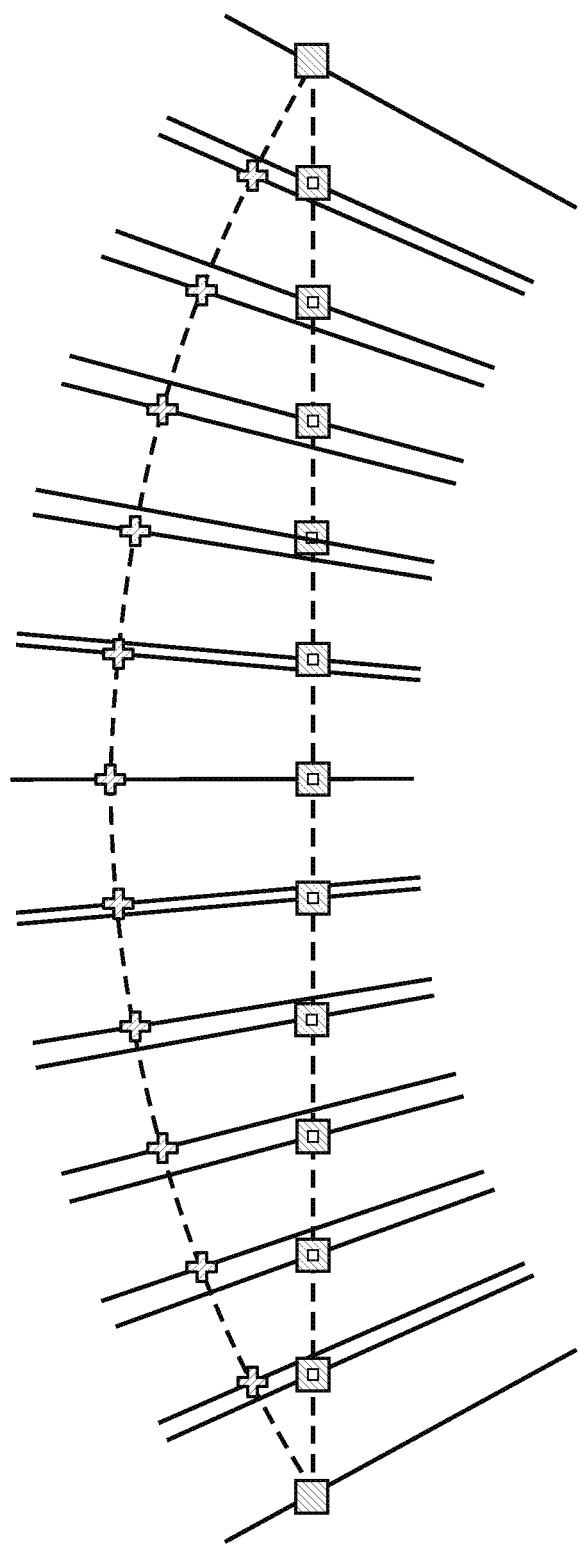
FIG. 23 illustrates a top view of an angular deviation between VBAP and linear cross-fading.

FIG. 23 illustrates a top view of an angular deviation between VBAP (+) and linear cross-fading (□). In particular, FIG. 23 illustrates the underlying approximation principle for the 60° example. The loudspeakers are the boundary of the shown angular range. The crosses mark the given target directions which consist of a set of equi-angular intermediate positions. If the two base vectors are multiplied by the corresponding cross-fading gains, the results are obtained that are marked by the squares. The angular deviations between the target directions and the result of the cross-fading approach are illustrated by the solid lines. From this geometric consideration it can be concluded a) that the approximation is the closer the smaller the loudspeaker opening angle is and b) that an opening angle of 60° can still be considered as being small.

The cross-fading gain only depends on the ratio between the panning angle and the opening angle between the loudspeakers. Hence, a greater opening angle results in the dashed graph shown in FIG. 22 scaled along the x-axis (azimuth angle). This is a desired property as it complies with the seventh design goal.

Power normalization may be conducted, e.g., by employing the formula:

$$a_n = \frac{g_n}{\|[g_1, g_2]^T\|}$$

Now, a 3D concept is provided.

While the parameter space is one-dimensional in the 2D case and only consists of the azimuth angle, it is two-dimensional in the 3D case and is spanned by the azimuth and the elevation angle. By specifying the mesh/loudspeaker polygons in this parameter space, compliance with the ninth design goal is achieved and the geometry distortion which can be observed for VBAP's Euclidean domain is avoided.

This can either be done manually or by means of an algorithm like the Quick-Hull algorithm which outputs a triangle mesh [3]. In the latter case, triangles can be combined to polygons, if their vertices are located within the same plane or at least within a certain tolerance range.

Figure 24:
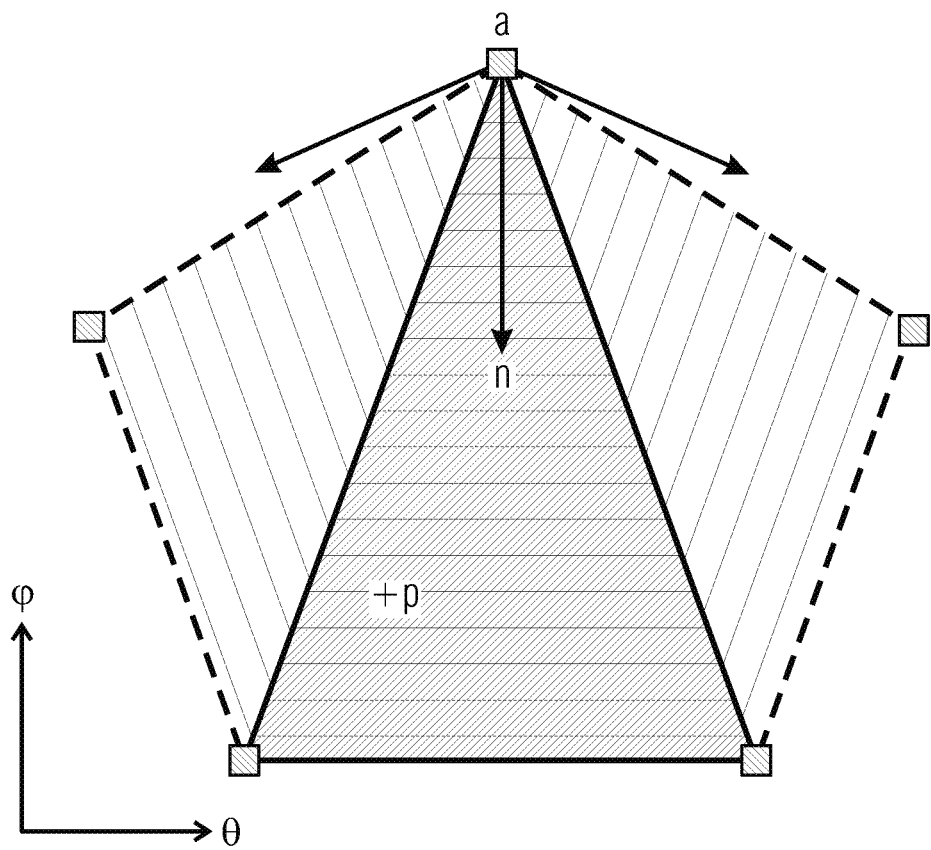
FIG. 24 illustrates a subdivision of polygon-defined body into triangles according to an embodiment, FIG. 25 indicates trajectories reproduced by test signals in a listening test.

FIG. 24 illustrates a subdivision of polygon-defined body into triangles according to an embodiment. In particular, FIG. 24 illustrates a contour plot of the panning gain for the topmost loudspeaker of an exemplary polygon. The x-axis indicates the azimuth angle, the y-axis indicates the elevation angle, squares indicate loudspeaker vertices, solid lines indicate gain contour, dashed lines indicate polygon edges, and arrows indicate normal vectors.

The linear cross-fading method can be transferred to the 3D case by defining linear cross-fading functions between the loudspeakers of a polygon. FIG. 24 illustrates this by a contour plot for the topmost loudspeaker which is part of a polygon defined by five loudspeakers. The loudspeaker directions, which are the vertices of the polygon shown by the dashed line, are marked by the squares. The gain for the topmost loudspeaker as a function of the panning direction within the polygon is shown by means of the solid contour lines.

In order to compute the cross-fading gain for a loudspeaker, the polygon first needs to be sub-divided into triangles specified by the loudspeaker vertex and the edges of the polygon. This sub-division is indicated in FIG. 24 by the dotted lines. The triangle in which the panning direction $p=[\theta_p,\phi_p]^T$ is located can be determined by computing two coefficients $\lambda$ and $\mu$, $$[\lambda,\mu]^T = [b-a,c-a]^{-1}(p-a), \qquad (5)$$

where $a=[\theta_a,\phi_a]^T$ denotes the direction of the loudspeaker for which the cross-fading gain is computed, and where $b=[\theta_b,\phi_b]^T$ and $c=[\theta_c,\phi_c]^T$ denote the remaining vertices of the triangle. The panning direction p is located inside the triangle, if all of the following conditions are fulfilled:

$$\lambda \geq 0 \qquad (6)$$

$$\mu \geq 0 \qquad (7)$$

$$\lambda + \mu \leq 1 \qquad (8)$$

For this triangle, the normal vector is then computed, e.g., according to $$n' = [\phi_b - \phi_c, \theta_c - \theta_b]^T \qquad (9)$$

$$n = \frac{n'}{n'(b-a)}. \qquad (10)$$

This normal vector then allows for computing the cross-fading gain as follows:

$$g = 1 - n(p-a) \qquad (11)$$

It should be noted that the sub-division into triangles and the computation of (9), (10), and (11) are performed for each loudspeaker of the polygon.

The final panning gains are then obtained by applying the energy normalization (3) to the cross-fading gains.

According to an embodiment, as a first step 2D crossfading is conducted, e.g., by applying the formula $$g_n = 1 - n_n(p-a_n)$$

And, in some embodiments, as a second step, power normalization is conducted, e.g., by applying the formula $$a_n = \frac{g_n}{\|[g_1, \ldots, g_N]^T\|}.$$

A special feature of the used coordinate system is the existence of the poles at ±90° elevation. As a pole may not be located within a polygon, a method like the generalized VBAP approach needs to be applied to solve this issue. In doing so, an additional vertex is added at ±90° elevation and the polygons which contain the poles are split. After computing the panning gains for this extended set of loudspeakers, the gains for the imaginary pole loudspeakers are downmixed to their physical neighbors.

Furthermore, as the poles are not points in the azimuth-elevation parameter space but lines, it is reasonable for the computation of the cross-fading gains to set the azimuth angle of the pole vertices to the azimuth angle of the panning direction.

All normal vectors besides those for the pole vertices can be pre-calculated as well as the inverse matrices which are needed for the determination of the polygon/triangle in which p is located. Consequently, the computational complexity for the determination of the panning gains during runtime is considerable low.

If the panning direction coincides with the position of one of the loudspeakers, then only this loudspeaker is active while two or more loudspeakers are active in between. The varying source extension as a consequence of the varying number of active loudspeakers can be compensated by means of Multiple Direction Amplitude Panning (MDAP) exactly in the same way as it is done for VBAP [18].

Some localization studies have shown that the Vector Base Intensity Panning (VBIP) method [16] based on Gerzon's Energy Vector [9] results in a smaller deviation between the panning direction and the perceived source location, especially at higher frequencies.

This is a behavior which is to some extend predictable by a binaural model [8]. In general, both methods can be combined into a frequency-dependent panning method as suggested by Pulkki [19]. The same principle can be applied to the proposed method by a frequency-dependent exponentiation of the cross-fading gains (11).

As already described above, according to some embodiments, instead of applying the gain, e.g., the gain of formula (11) on the samples of an audio input signal, a square root of the gain, e.g., a square root of the gain of formula (11) may, e.g., be applied on the samples of the audio input signal.

Figure 25:
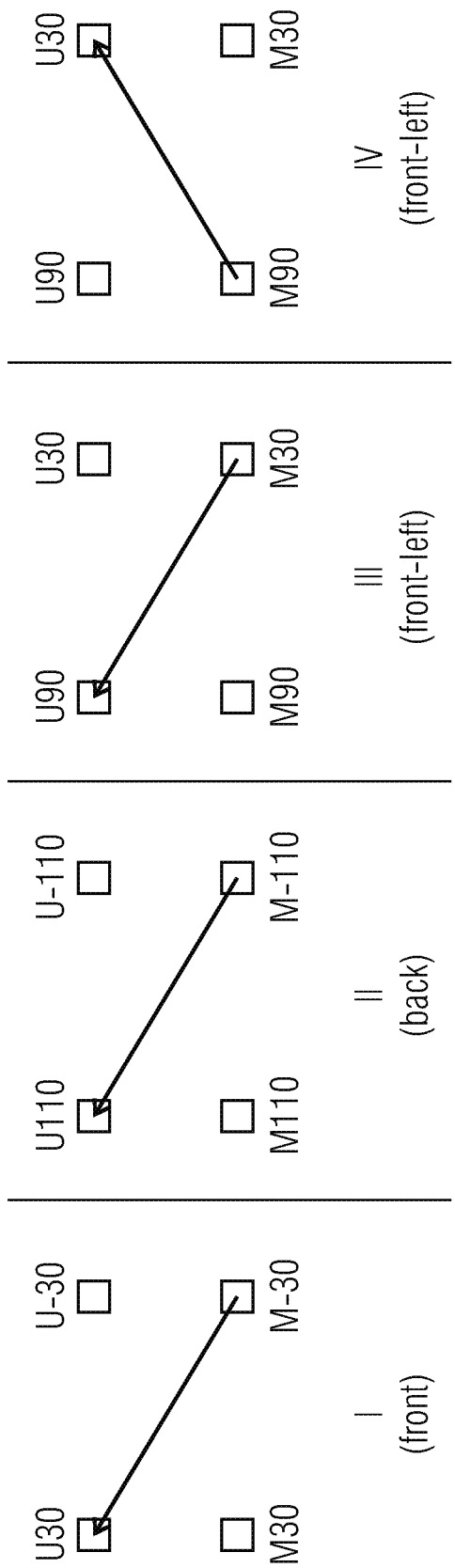

In order to assess the performance of the proposed panning concepts, a listening test was performed where four different object trajectories were investigated: "front right" to "upper front left", "rear right" to "upper rear left", "front left" to "upper side left", and "side left" to "upper front left". FIG. 25 indicates these trajectories.

The conducted listening test was not a MUSHRA test. The "Ref" signal is a reference with regard to all quality features besides location accuracy. The test signals shall reproduce one of the trajectories. Participants were encouraged to slightly move their head within ±30° azimuth/elevation angle. The timbre, the location accuracy/smoothness of movement, the source extension/focus, and the overall quality of all test signals were judged and commented.

Each test item contained a single object at constant velocity which was rendered with an elevation angle that was linearly interpolated between 0° and 35° and an azimuth angle that was linearly interpolated as follows: Trajectory I (front): −30° to 30°; trajectory II (back): −110° to 110°; trajectory III (front-left): 30° to 90°; and trajectory IV (front-left): 90° to 30°.

For the generation of the test signals, three kinds of mono signals were used, which were then rendered along the four trajectories, namely 1: "Speech"; 2: "Pink Noise"; and 3: "Beat".

In order to reduce the influence of the short-term memory, short stimuli were chosen. The "Speech" signal was a 6.7 s long sentence from a female speaker. The "Pink Noise" signal contained 6 s of stationary pink noise. The "Beat" signal also lasted 6 s and contained a beat of a woodblock and a castanet struck in turn at 160 bpm. The three input signals were manually adjusted to similar loudness.

Each of the 12 test items was rendered using the following panning concepts, namely 1: "efap" (the proposed concepts); 2: "vbap A"; and 3: "vbap B".

All methods involved the shown loudspeaker sets. The two VBAP variants only differed by the triangulation i.e., the diagonal within the rectangular loudspeaker arrangement, whereas the diagonal of "vbap A" coincided with the trajectories I, II, and III.

Due to the difficulty to provide a proper reference for the rendered signals, the input signal played back over the center speaker was used as tonal reference.

The participants of the conducted listening test, which took place in the ITU-R BS.1116-1 compliant sound lab "Mozart" at Fraunhofer IIS, used a conventional MUSHRA software that was configured to leave out the hidden references and lower anchors (see [11], [12]).

In total 4 listening test instructions were handed out to the participants in written form which only differed by the highlighted quality. The loudspeakers were marked by the same labels which were also used within the instructions. The test participants were asked to exclusively grade the quality features/attributes "timbre", "localization accuracy/smoothness of movement", "source extension/focus", and "overall quality" of the presented stimuli, where each test was conducted on a different day.

Table 1 illustrates test material used during the training phase.

TABLE 1

| No. | Signal | Trajectory | Panning Method |
|---|---|---|---|
| 1 | "Speech" | — | (reference) |
| 2 | "Speech" | I (front) | "vbap A" |
| 3 | "Speech" | IV (front-left) | "efap" |
| 4 | "Speech" | II (back) | "vbap B" |
| 5 | "Pink" | — | (reference) |
| 6 | "Pink" | II (back) | "efap" |
| 7 | "Pink" | I (front) | "vbap B" |
| 8 | "Pink" | IV (front-left) | "vbap A" |
| 9 | "Beat" | — | (reference) |
| 10 | "Beat" | IV (front-left) | "vbap B" |
| 11 | "Beat" | II (back) | "vbap A" |
| 12 | "Beat" | I (front) | "efap" |

In the following, the test results are presented.

Figure 26:
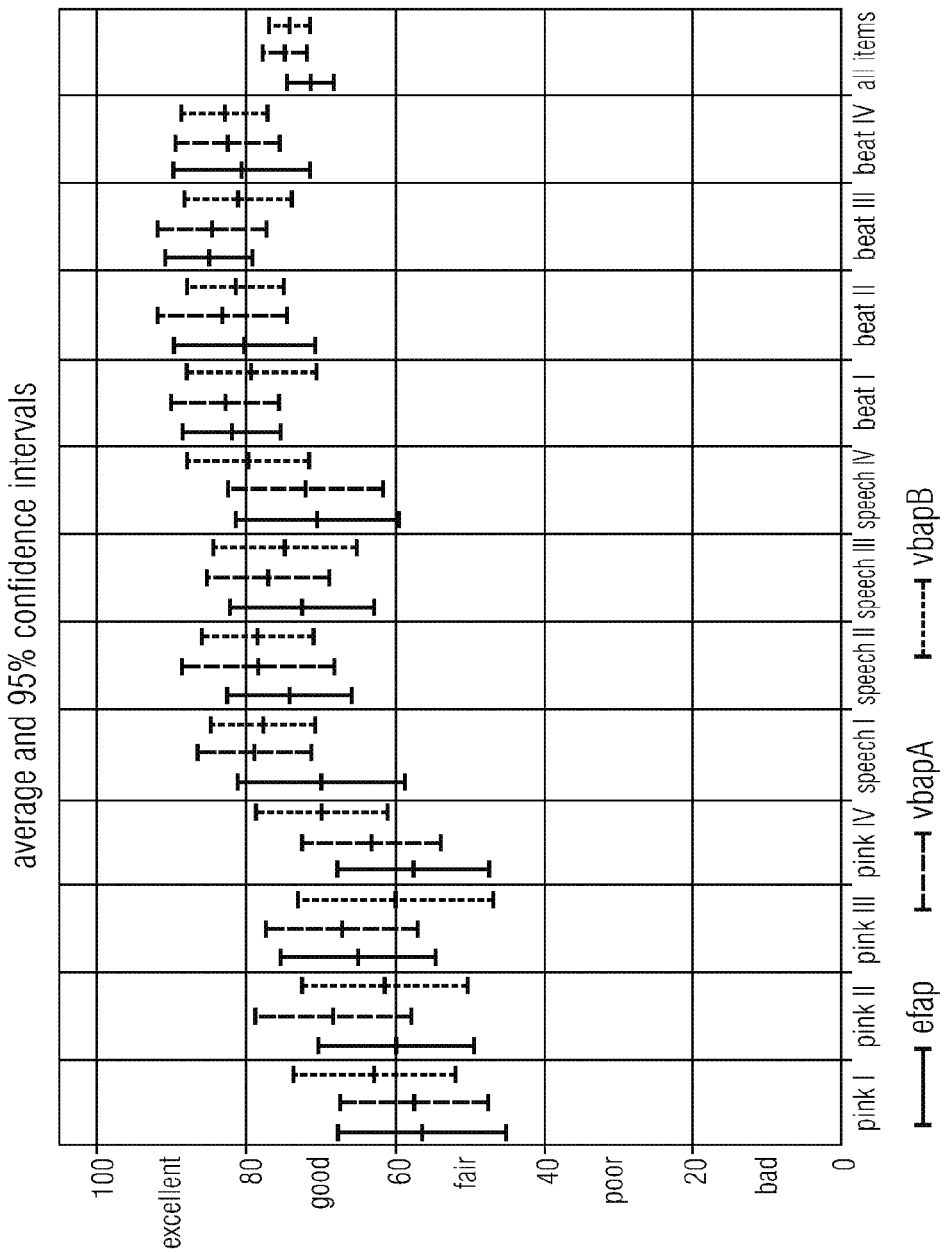
FIG. 26 shows the average and the 95% confidence interval of test results for a first listening test where the timbre was rated.

FIG. 26 shows the average and the 95% confidence interval of the test results for the first listening test where the timbre was rated.

It details the results for all combinations of input signals ("Pink", "Speech", and "Beat") and trajectories (I, II, III, and IV). The average over all conditions indicates that the timbre of the VBAP output is slightly closer to the reference than the output of the EFAP method. This observation is confirmed by the difference plot shown in FIG. 27.

Figure 27:
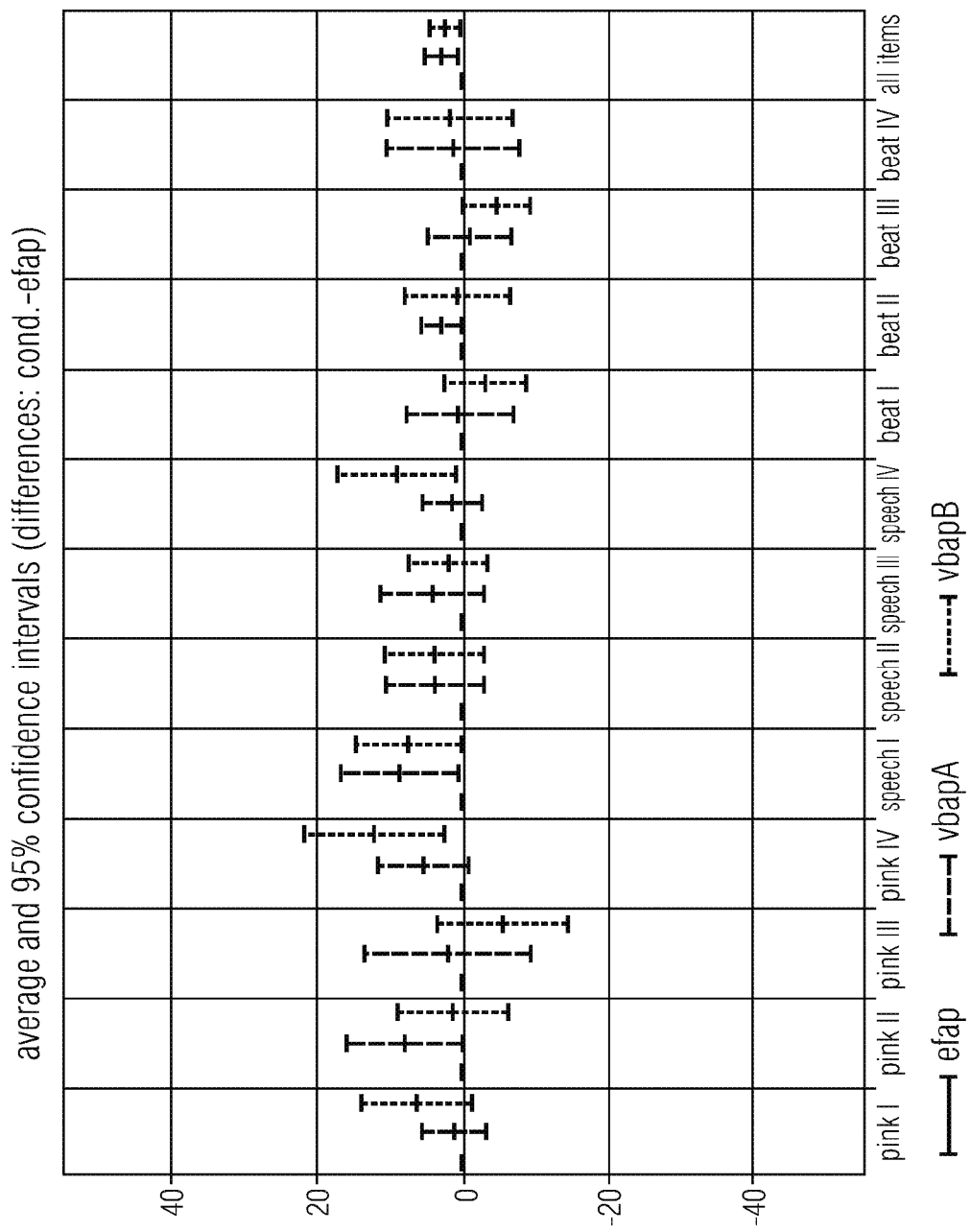
FIG. 27 illustrates a difference plot for the first listening test where the timbre was rated.

FIG. 27 illustrates a difference plot for the first listening test where the timbre was rated.

The given comments revealed that the EFAP output featured a slightly stronger bass boost. This is an expected behavior as the incoherent summation which is the basic assumption for the power normalization, no longer holds at low frequencies.

Hence, a greater number of loudspeakers causes a greater bass boost effect which can be compensated by means of an equalizer [19].

Figure 28:
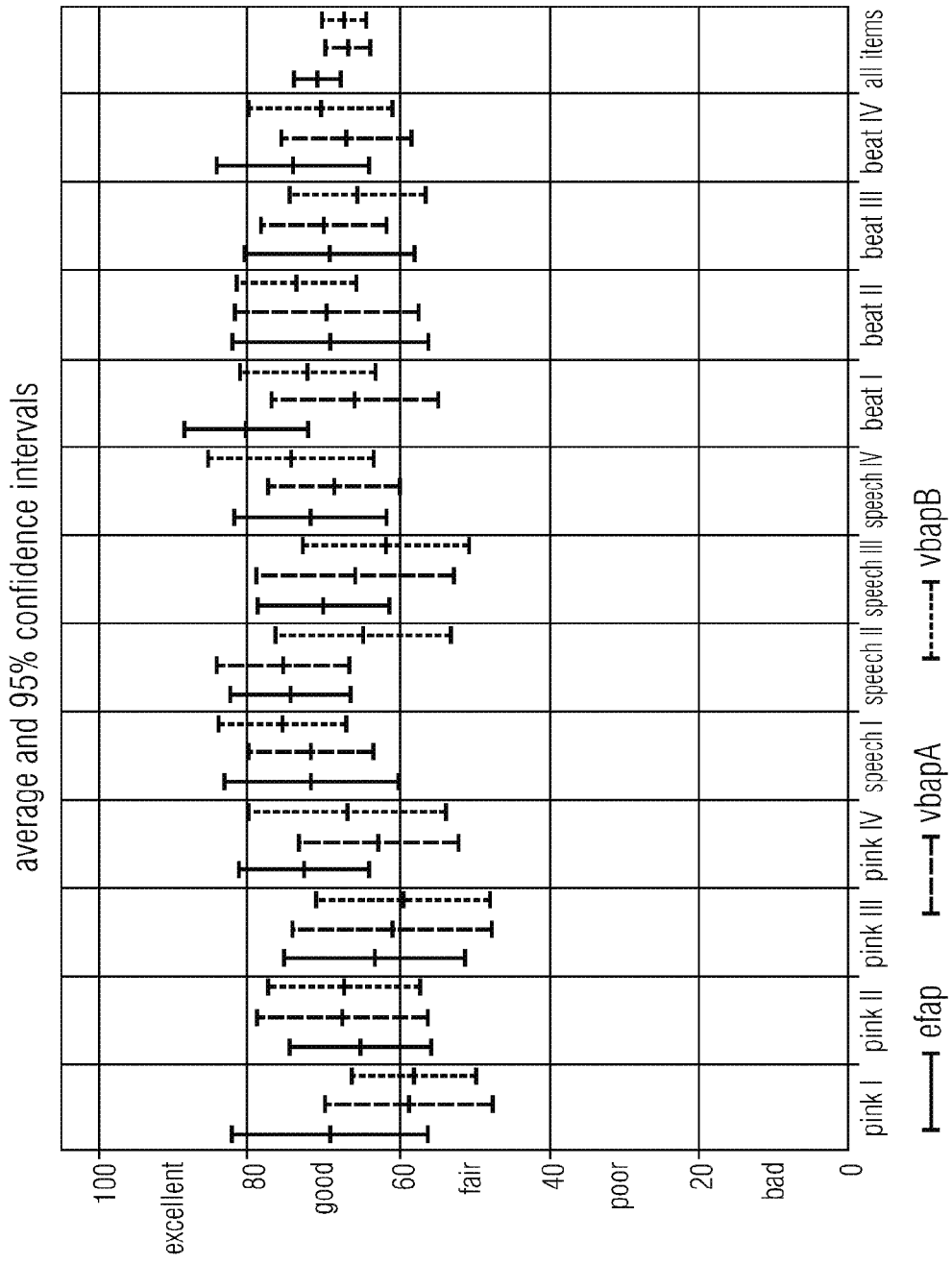
FIG. 28 shows the test results for a second test where the location accuracy and smoothness of movement was rated.

FIG. 28 shows the test results for a second test where the location accuracy and smoothness of movement was rated.

Figure 29:
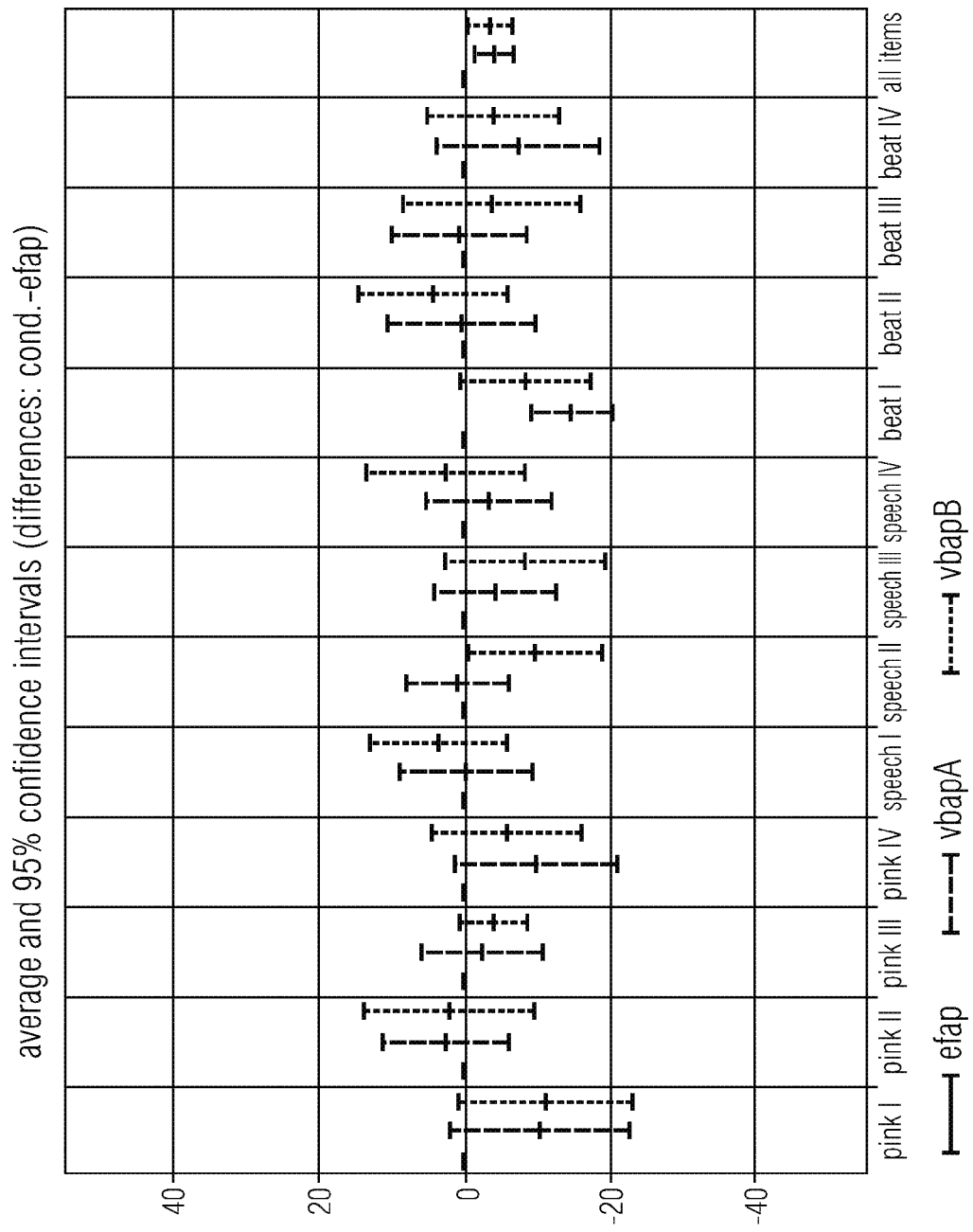
FIG. 29 illustrates a difference plot for the second listening test where the location accuracy and smoothness of movement was rated.

The corresponding difference plot shown in FIG. 29 reveals that the EFAP method results in a smoother movement/better location accuracy than VBAP.

Some subjects gave the feedback that the VBAP trajectories were partly too low and then quickly moved to the upper loudspeaker at the end.

This is an observation which can be explained by the previously mentioned geometric distortion which results in stronger gains for the middle layer loudspeakers.

Figure 30:
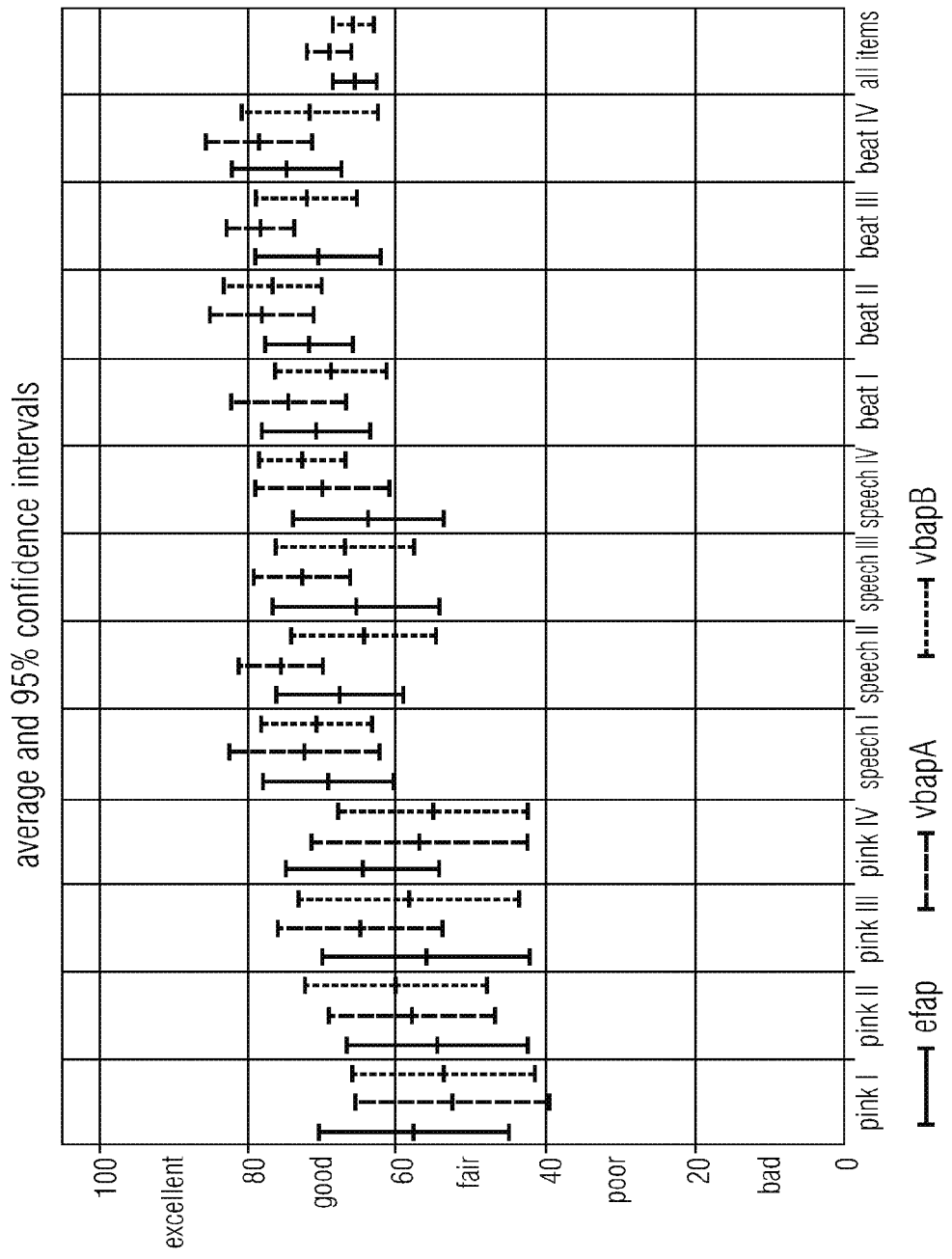
FIG. 30 shows the test results for a third test where the source extension and focus was rated.

FIG. 30 shows the test results for the third test where the source extension and focus was rated.

Figure 31:
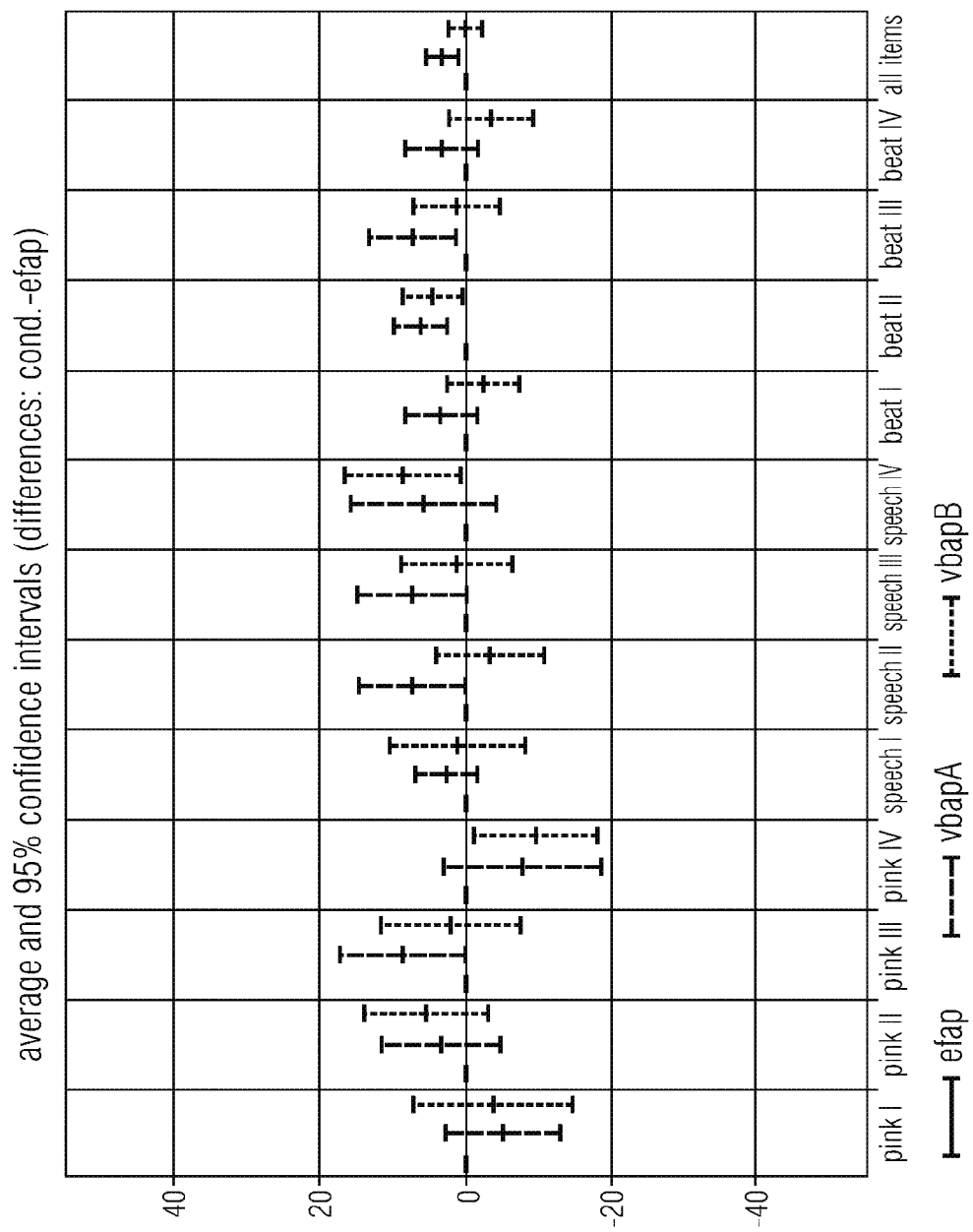
FIG. 31 illustrates a difference plot for the third listening test where the source extension and focus was rated.

The corresponding difference plot is shown in FIG. 31. It can be observed that EFAP performs either equally well or slightly worse than VBAP with respect to the source extension. This observation can be explained by the fact that "vbap A" mostly resulted in pair-wise panning and thus caused a smaller perceived source extension compared to the other triangulation variant or EFAP.

Figure 32:
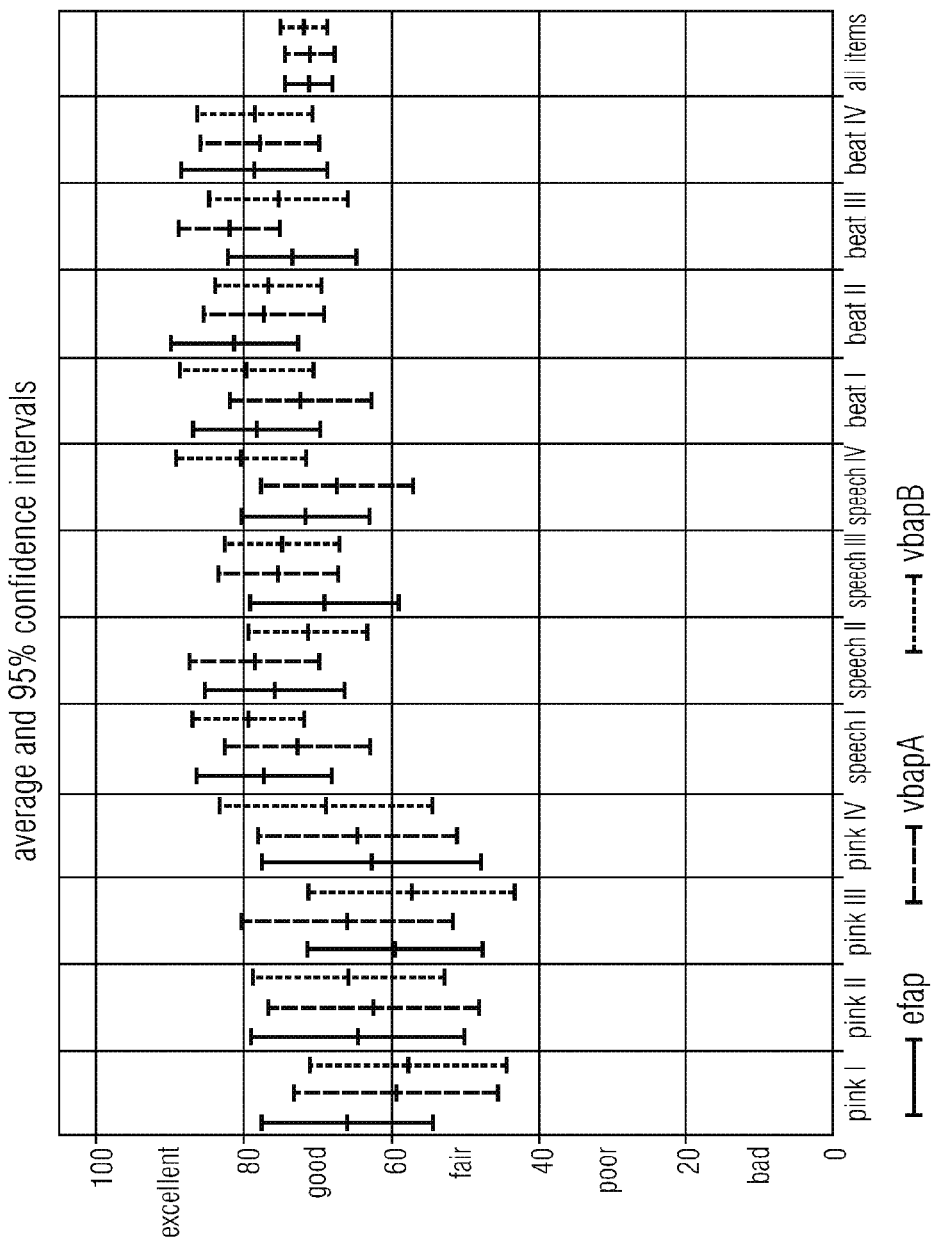
FIG. 32 illustrates the results for the overall quality.
Figure 33:
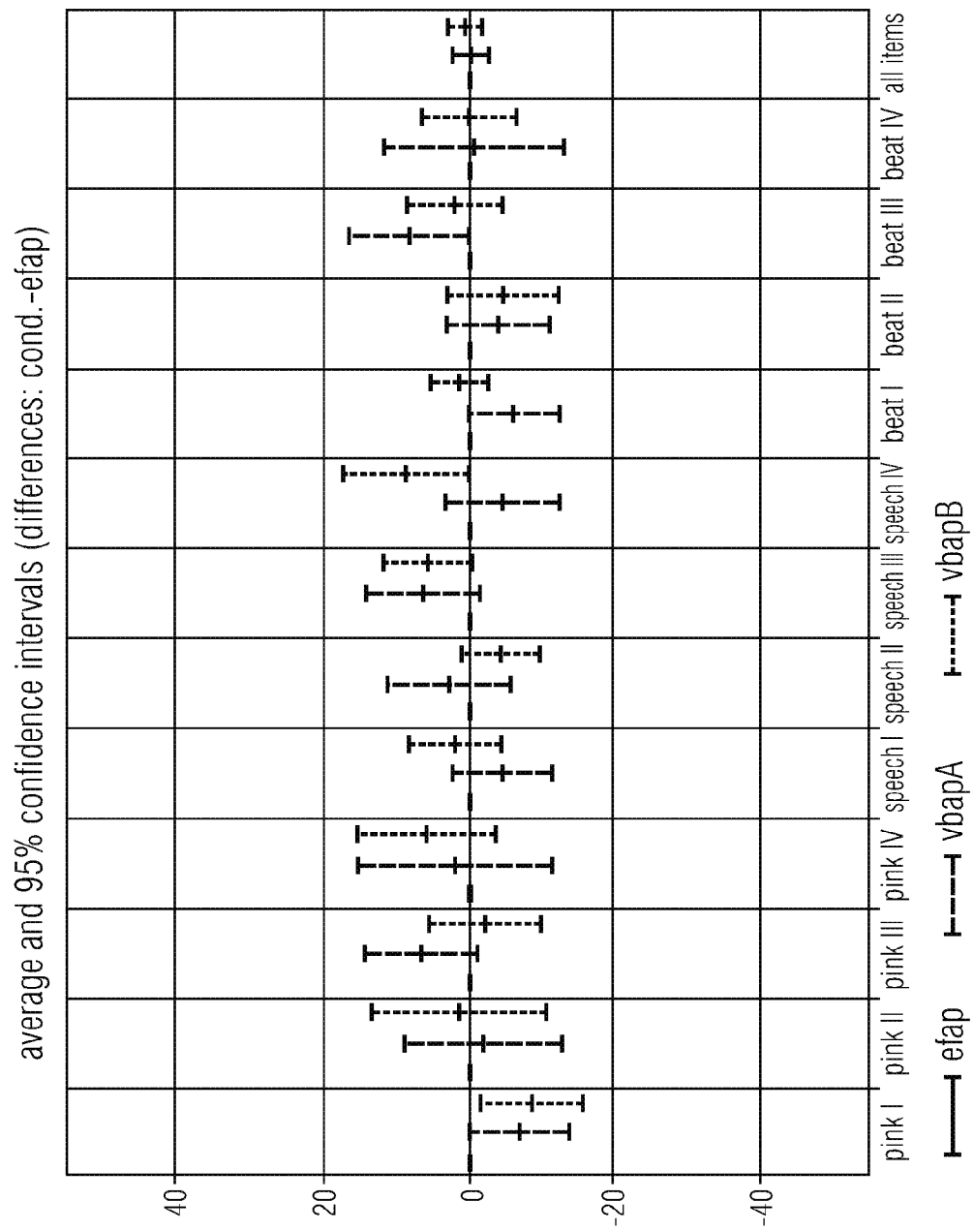
FIG. 33 illustrates a difference plot for the results for the overall quality.

The results for the overall quality are shown in FIG. 32 and FIG. 33. While some subjects clearly favored one of the test candidates, the results are totally balanced on average.

In embodiments, symmetric panning gains for symmetric setups by N-wise panning defined via polygons are realized.

The listening test, compared the provided concepts with VBAP, gives evidence that the proposed concepts result in a better location accuracy. The greater number of active loudspeakers stabilizes the position and trajectory of the phantom source, but it also produces a slightly stronger bass boost and a slightly greater source extension.

While some subjects preferred the improved spatial accuracy, others put more emphasize on the timbre, resulting in a balanced overall preference. The proposed concepts are beneficial in applications where the location accuracy and smoothness of movement is of importance. This property is further improved by frequency-dependent exponentiation of the calculated cross-fading gains while the timbre could be compensated by means of equalization.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods may be performed by any hardware apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] "SpaceMap" Software by Meyer Sound. URL: http://www.meyersound.com/products/d-mitri/spacemap.htm.

[2] Ando, A. and Hamasaki, K. Sound Intensity Based Three-Dimensional Panning. In 126th AES Convention, Munich, Germany, May 2009.

[3] Barber, C. B., Dobkin, D. P., and Huhdanpaa, H. The QuickHull Algorithm for Convex Hulls. ACM Trans. Math. Softw., 22(4):469-483, 1996.

[4] Bekesy, G. v. Experiments in Hearing. McGraw-Hill, New York, N.Y., USA, 1960.
[5] Bennett, J. C., Barker, K., and Edeko, F. O. A New Approach to the Assessment of Stereophonic Sound System Performance. J. Audio Eng. Soc., 33(5):314-321, 1985.
[6] Blauert, J. Spatial Hearing, The Psychophysics of Human Sound Localization. MIT Press, Cambridge, Mass., second edition, 1997.
[7] Craven, P. G. Continuous Surround Panning for 5-Speaker Reproduction. In AES 24th Int. Conference, Banff, Alberta, Canada, June 2003.
[8] Frank, M. Localization Using Different Amplitude-Panning Methods in the Frontal Horizontal Plane. In EAA Joint Symposium on Auralization and Ambisonics, Berlin, Germany, April 2014.
[9] Gerzon, M. A. General Metatheory of Auditory Localisation. In 92nd AES Convention, Vienna, Austria, March 1992.
[10] Gretzki, R. and Silzle, A. A New Method for Elevation Panning Reducing the Size of the Resulting Auditory Events. In EAA Symposium "TecniAcustica 2003", Bilbao, Spain, 2003.
[11] ITU-R. Rec. ITU-R BS.1116-1, Methods for the Subjective Assessment of Small Impairments in Audio Systems Including Multichannel Sound Systems, 2003.
[12] ITU-R. Rec. ITU-R BS.1534-1, Method for the Subjective Assessment of Intermediate Quality Level of Coding Systems, 2003.
[13] ITU-R. Rec. ITU-R BS.775-1, Multichannel Stereophonic Sound System with and without Accompanying Picture, 2006.
[14] ITU-R. Rep. ITU-R BS.2266-1, Framework of Future Audio Representation Systems, 2013.
[15] Lee, H. The Relationship Between Interchannel Time and Level Differences in Vertical Sound Localization and Masking. In 131st AES Convention, New York, N.Y., USA, October 2011.
[16] Pernaux, J.-M., Boussard, P., and Jot, J.-M. Virtual sound source positioning and mixing in 5.1 implementation on the real-time system genesis. In First COST-G6 Workshopon Digital Audio Effects (DAFx-98), Barcelona, Spain, 1998.
[17] Pulkki, V. Virtual Sound Source Positioning Using Vector Base Amplitude Panning. J. Audio Eng. Soc., 45(6):456-466, 1997.
[18] Pulkki, V. Uniform Spreading of Amplitude Panned Virtual Sources. In IEEE Workshop on Applications of Signal Processing to Audio and Acoustics, New Paltz, N.Y., USA, October 1999.
[19] Pulkki, V., Karjalainen, M., and Välimäki, V. Localization, Coloration, and Enhancement of Amplitude-Panned Virtual Sources. In AES 16th Int. Conference, Rovaniemi, Finland, 1999.
[20] Silzle, A. 3D Audio Quality Evaluation: Theory and Practice. In International Conference on Spatial Audio (ICSA), Erlangen, Germany, February 2014.
[21] Theile, G. and Plenge, G. Localization of Lateral Phantom-Sources. In 53rd AES Convention, Berlin, Germany, 1976.

The invention claimed is:

1. An apparatus for generating four or more audio output signals, comprising:
a panning gain determiner, and
a signal processor,
wherein the panning gain determiner is configured to determine a proper subset from a set of five or more loudspeaker positions, so that the proper subset comprises four or more of the five or more loudspeaker positions,
wherein the panning gain determiner is configured to determine the proper subset depending on a panning position and depending on the five or more loudspeaker positions,
wherein the panning gain determiner is configured to determine a panning gain for each of the four or more audio output signals by determining said panning gain depending on the panning position and depending on the four or more loudspeaker positions of the proper subset, and
wherein the signal processor is configured to generate each audio output signal of the four or more audio output signals depending on the panning gain for said audio output signal and depending on an audio input signal.

2. The apparatus according to claim 1,
wherein each loudspeaker position of the four or more loudspeaker positions of the proper subset is associated with exactly one of the four or more audio output signals, and wherein each of the four or more audio output signals is associated with exactly one of the four or more loudspeaker positions of the proper subset,
wherein the panning gain determiner is configured to determine, for each audio output signal of the four or more audio output signals, a group of associated loudspeaker positions, being associated with said audio output signal, depending on the loudspeaker position of each of the four or more audio output signals and depending on the panning position, so that said group of associated loudspeaker positions comprises the loudspeaker position being associated with said audio output signal and at least two further loudspeaker positions of the four or more loudspeaker positions of the proper subset, wherein at least one of the four or more loudspeaker positions of the proper subset is not comprised by said group of associated loudspeaker positions,
wherein the panning gain determiner is configured to calculate, for each audio output signal of the four or more audio output signals, the panning gain for said audio output signal depending on the panning position and depending on the loudspeaker positions of the group of associated loudspeaker positions being associated with said audio output signal, and
wherein the group of associated loudspeaker positions being associated with a first one of the four or more audio output signals is not equal to the group of associated loudspeaker positions being associated with a different second one of the four or more audio output signals.

3. The apparatus according to claim 2, wherein, for each of the four or more audio output signals, the panning gain determiner is configured to determine the group of associated loudspeaker positions, being associated with said audio output signal, so that said group of associated loudspeaker positions comprises exactly three of the four or more loudspeaker positions of the proper subset.

4. The apparatus according to claim 1, wherein the panning position and each loudspeaker position of the set of five or more loudspeaker positions each indicates a position within a two-dimensional coordinate system.

5. The apparatus according to claim 4, wherein the panning position and each loudspeaker position of the set of five or more loudspeaker positions each indicates an azimuth angle and an elevation angle within the two-dimensional coordinate system.

6. The apparatus according to claim 4, wherein the panning gain determiner is configured to determine the proper subset such that a subset-specific polygon exists, wherein the vertices of the proper subset-specific polygon are the loudspeaker positions of the proper subset, and wherein the panning position is enclosed by the subset-specific polygon.

7. The apparatus according to claim 6, wherein the subset-specific polygon does not enclose any of the five or more loudspeaker positions which is not comprised by the proper subset.

8. The apparatus according to claim 6, wherein a body defined by the subset-specific polygon is convex.

9. The apparatus according to claim 4, wherein, for each of the four or more audio output signals, the panning gain determiner is configured to determine the group of associated loudspeaker positions, being associated with said audio output signal, such that a group-specific polygon exists, wherein the vertices of the group-specific polygon are the loudspeaker positions of said group of associated loudspeaker positions, and wherein the panning position is enclosed by said group-specific polygon.

10. The apparatus according to claim 9, wherein the group-specific polygon, being determined for each of the four or more audio output signals, does not enclose any of the five or more loudspeaker positions which is not comprised by the proper subset.

11. The apparatus according to claim 9, wherein the group-specific polygon, being determined for each of the four or more audio output signals, a body defined by said group-specific polygon is convex.

12. The apparatus according to claim 4, wherein, for each of the four or more audio output signals, the panning gain determiner is configured to determine the group of associated loudspeaker positions, being associated with said audio output signal, so that the group of associated loudspeaker positions comprises exactly the loudspeaker position being associated with said audio output signal and two further loudspeaker positions of the proper subset, and so that the panning position is located within a triangle or on an edge of said triangle in the two-dimensional coordinate system, wherein each loudspeaker position of the group of associated loudspeaker positions indicates a vertex of said triangle in the two-dimensional coordinate system.

13. The apparatus according to claim 12, wherein, for each audio output signal of the four or more audio output signals, the panning gain determiner is configured to select a first loudspeaker position, a second loudspeaker position, and a third loudspeaker position of the four or more loudspeaker positions as the loudspeaker positions of the group of associated loudspeaker positions, being associated with said audio output signal, if in $$[\lambda,\mu]^T = [b-a, c-a]^{-1}(p-a),$$

$\lambda$ and $\mu$ satisfy $$\lambda \geq 0,$$

$$\mu \geq 0,$$

$$\lambda + \mu \leq 1,$$

wherein $\lambda$ is a first real number, wherein $\mu$ is a second real number, wherein a is a first vector comprising two first vector components, wherein a indicates the first loudspeaker position, wherein a first one of the two first vector components indicates a first coordinate value of the first loudspeaker position within the two-dimensional coordinate system, and wherein a second one of the two first vector components indicates a second coordinate value of the first loudspeaker position within the two-dimensional coordinate system, wherein b is a second vector comprising two second vector components, wherein b indicates the second loudspeaker position, wherein a first one of the two second vector components indicates a first coordinate value of the second loudspeaker position within the two-dimensional coordinate system, and wherein a second one of the two second vector components indicates a second coordinate value of the second loudspeaker position within the two-dimensional coordinate system, wherein c is a third vector comprising two third vector components, wherein c indicates the third loudspeaker position, wherein a first one of the two third vector components indicates a first coordinate value of the third loudspeaker position within the two-dimensional coordinate system, and wherein a second one of the two third vector components indicates a second coordinate value of the third loudspeaker position within the two-dimensional coordinate system, wherein p is a fourth vector comprising two fourth vector components, wherein p indicates the panning position, wherein a first one of the two fourth vector components indicates a first coordinate value of the panning position within the two-dimensional coordinate system, and wherein a second one of the two fourth vector components indicates a second coordinate value of the panning position within the two-dimensional coordinate system.

14. The apparatus according to claim 12, wherein the panning gain determiner is configured to calculate, for each audio output signal of the four or more audio output signals, the panning gain for said audio output signal depending on a first distance being a shortest distance between the panning position and a first straight line through the two further loudspeaker positions of the group of associated loudspeaker positions, and depending on a second distance, being a shortest distance between the loudspeaker position being associated with said audio output signal and a second straight line through the panning position, wherein said second straight line is parallel to said first straight line.

15. The apparatus according to claim 12,
wherein the panning gain determiner is configured to calculate, for each audio output signal of the four or more audio output signals, the panning gain depending of a ratio of a first distance and a sum of a first distance and the second distance,
wherein the first distance indicates a shortest distance between the panning position and a first straight line through the two further loudspeaker positions of the group of associated loudspeaker positions, and
wherein the second distance indicates a shortest distance between the loudspeaker position being associated with said audio output signal position and a second straight line through the panning position, wherein said second straight line is parallel to said first straight line.

16. The apparatus according to claim 13,
wherein, for each of the four or more audio output signals, the panning gain determiner is configured to determine said panning gain according to the formula $$g = 1 - n(p-a)$$

wherein g is said panning gain,
wherein n is a fifth vector being defined according to $$n = \frac{n'}{n'(b-a)},$$

wherein n' is a sixth vector being defined according to $$n' = [\phi_b - \phi_c, \theta_c - \theta_b]^T,$$

wherein $\theta_b$ indicates the first coordinate value of the loudspeaker position, being assigned to the second audio output signal,
wherein $\phi_b$ indicates the second coordinate value of the loudspeaker position, being assigned to the second audio output signal,
wherein $\theta_c$ indicates the first coordinate value of the loudspeaker position, being assigned to the third audio output signal, and
wherein $\phi_c$ indicates the second coordinate value of the loudspeaker position, being assigned to the third audio output signal.

17. The apparatus according to claim 1,
wherein the audio input signal comprises a plurality of audio input samples, and
wherein the signal processor is configured to generate each audio output signal of the four or more audio output signals by multiplying each of one or more of the audio input samples of the audio input signal with the panning gain for said audio output signal to acquire one or more audio output samples of the audio output signal.

18. The apparatus according to claim 1,
wherein the audio input signal comprises a plurality of audio input samples, and
wherein the signal processor is configured to generate each audio output signal of the four or more audio output signals by multiplying each of one or more of the audio input samples of the audio input signal with a square root of the panning gain for said audio output signal to acquire one or more audio output samples of the audio output signal.

19. The apparatus according to claim 1,
wherein each loudspeaker position of the four or more loudspeaker positions of the proper subset is associated with exactly one of the four or more audio output signals, and wherein each of the four or more audio output signals is associated with exactly one of the four or more loudspeaker positions of the proper subset,
wherein the panning gain determiner is configured to calculate, for each audio output signal of the four or more audio output signals, the panning gain for said audio output signal depending on the panning position and depending on the loudspeaker position of each of the four or more audio output signals.

20. The apparatus according to claim 1,
wherein the panning gain determiner is configured to determine the panning gain for each audio output signal of the four or more audio output signals for a first point in time as a first time-dependent panning gain for said audio output signal, and
wherein the panning gain determiner is configured to determine a further panning gain for each audio output signal of the four or more audio output signals for a different second point in time as a second time-dependent panning gain for said audio output signal, said second time-dependent panning gain being different from the first time-dependent panning gain for said audio output signal.

21. The apparatus according to claim 1,
wherein the panning gain determiner is configured to determine the panning gain for each audio output signal of the four or more audio output signals for a first frequency as a first frequency-dependent panning gain for said audio output signal, and
wherein the panning gain determiner is configured to determine a further panning gain for each audio output signal of the four or more audio output signals for a different second frequency as a second frequency-dependent panning gain for said audio output signal, said second frequency-dependent panning gain being different from the first frequency-dependent panning gain for said audio output signal.

22. The apparatus according to claim 1, comprising:
wherein the audio input signal is a first audio input signal, wherein the panning position is a first panning position, wherein the panning gain is a first input-signal-dependent panning gain, and wherein the proper subset is a first proper subset,
wherein the panning gain determiner is configured to determine one or more further proper subsets from a set of five or more loudspeaker positions, so that each of the one or more further proper subsets comprises four or more of the five or more loudspeaker positions,
wherein the panning gain determiner is configured to determine each of the one or more further proper subsets depending on one of one or more further panning positions and depending on the five or more loudspeaker positions,
wherein the panning gain determiner is configured to determine one or more further input-signal-dependent panning gains for each of the four or more audio output signals by determining each of the one or more further panning gains depending on one of the one or more further panning positions and depending on the four or more loudspeaker positions of one of the one or more further proper subsets, and
wherein the signal processor is configured to generate each audio output signal of the four or more audio output signals depending on the first input-signal-dependent panning gain for said audio output signal, depending on the one or more further input-signal-dependent panning gains for said audio output signal, depending on the audio input signal, and depending on the one or more further audio input signals.

23. A system comprising:
five or more loudspeakers, and
an apparatus according to claim 1,
wherein each of the five or more loudspeakers is associated with exactly one loudspeaker position of the set of five or more loudspeaker positions,
wherein each of the four or more audio output signals is associated with exactly one loudspeaker position of the four or more loudspeaker positions of the proper subset, and wherein each of the four or more audio output signals is associated with exactly one of the four or more loudspeaker positions of the proper subset, wherein the system is configured to output each audio output signal of the four or more audio output signals by the loudspeaker which is associated with the same loudspeaker position as said audio output signal.

24. The system according to claim 23, wherein the system is configured to output none of the four or more audio output signals by any of the four or more loudspeakers not being associated with the same loudspeaker position as said audio output signal.

25. The system according to claim 23, wherein the system is configured to not output any of the four or more loudspeaker signals by at least one of the five or more loudspeakers.

26. A method for generating four or more audio output signals, comprising:
  determining a proper subset from a set of five or more loudspeaker positions, so that the proper subset comprises four or more of the five or more loudspeaker positions, wherein determining the proper subset is conducted depending on a panning position and depending on the five or more loudspeaker positions,
  determining a panning gain for each of the four or more audio output signals by determining said panning gain depending on the panning position and depending on the four or more loudspeaker positions of the proper subset, and
  generating each audio output signal of the four or more audio output signals depending on the panning gain for said audio output signal and depending on an audio input signal.

27. A non-transitory digital storage medium having stored thereon a computer program for performing a method for generating four or more audio output signals, comprising:
  determining a proper subset from a set of five or more loudspeaker positions, so that the proper subset comprises four or more of the five or more loudspeaker positions, wherein determining the proper subset is conducted depending on a panning position and depending on the five or more loudspeaker positions,
  determining a panning gain for each of the four or more audio output signals by determining said panning gain depending on the panning position and depending on the four or more loudspeaker positions of the proper subset, and
  generating each audio output signal of the four or more audio output signals depending on the panning gain for said audio output signal and depending on an audio input signal,
  when being executed on a computer or signal processor.

28. An apparatus for generating four or more audio output signals, wherein each loudspeaker position of four or more loudspeaker positions is associated with exactly one of the four or more audio output signals, and wherein each of the four or more audio output signals is associated with exactly one of the four or more loudspeaker positions, wherein the apparatus comprises:
  a panning gain determiner, and
  a signal processor,
  wherein the panning gain determiner is configured to determine, for each audio output signal of the four or more audio output signals, a group of associated loudspeaker positions, being associated with said audio output signal, depending on the loudspeaker position of each of the four or more audio output signals and depending on a panning position, so that said group of associated loudspeaker positions comprises the loudspeaker position being associated with said audio output signal and at least two further loudspeaker positions of the four or more loudspeaker positions, wherein at least one of the four or more loudspeaker positions is not comprised by said group of associated loudspeaker positions,
  wherein the panning gain determiner is configured to calculate, for each audio output signal of the four or more audio output signals, the panning gain for said audio output signal depending on the panning position and depending on the loudspeaker positions of the group of associated loudspeaker positions being associated with said audio output signal, and
  wherein the signal processor is configured to generate each audio output signal of the four or more audio output signals depending on the panning gain for said audio output signal and depending on an audio input signal,
  wherein the group of associated loudspeaker positions being associated with a first one of the four or more audio output signals is not equal to the group of associated loudspeaker positions being associated with a different second one of the four or more audio output signals.

29. The apparatus according to claim 28, wherein, for each of the four or more audio output signals, the panning gain determiner is configured to determine the group of associated loudspeaker positions, being associated with said audio output signal, so that said group of associated loudspeaker positions comprises exactly three of the four or more audio output signals.

30. The apparatus according to claim 28, wherein the panning position and each loudspeaker position of the four or more loudspeaker positions each indicates a position within a two-dimensional coordinate system.

31. The apparatus according to claim 30, wherein the panning position and each loudspeaker position of the four or more loudspeaker positions each indicates an azimuth angle and an elevation angle within the two-dimensional coordinate system.

32. The apparatus according to claim 30, wherein, for each of the four or more audio output signals, the panning gain determiner is configured to determine the group of associated loudspeaker positions, being associated with said audio output signal, such that a group-specific polygon exists, wherein the vertices of the group-specific polygon are the loudspeaker positions being associated with the associated output signals of said group of associated loudspeaker positions, and wherein the panning position is enclosed by said group-specific polygon.

33. The apparatus according to claim 32, wherein the group-specific polygon, being determined for each of the four or more audio output signals, does not enclose any of the four or more loudspeaker positions which is associated with an audio output signal which is not comprised by said group of associated loudspeaker positions.

34. The apparatus according to claim 32, wherein a body defined by the group-specific polygon, being determined for each of the four or more audio output signals, is convex.

35. The apparatus according to claim 30, wherein, for each of the four or more audio output signals, the panning gain determiner is configured to determine the group of associated loudspeaker positions, being associated with said audio output signal, so that the group of associated loudspeaker positions comprises exactly said audio output signal and two further audio output signals of the four or more audio output signals, and so that the panning position is located within a triangle or on an edge of said triangle in the two-dimensional coordinate system, wherein the loudspeaker position of each of the audio output signals of the group of associated loudspeaker positions indicates a vertex of said triangle in the two-dimensional coordinate system.

36. The apparatus according to claim 35, wherein, for each of the four or more audio output signals, the panning gain determiner is configured to select a first loudspeaker position, a second loudspeaker position and a third loudspeaker position as the loudspeaker positions of the group of associated loudspeaker positions, being associated with said audio output signal, if in $[\lambda,\mu]^T=[b-a,c-a]^{-1}(p-a)$, $\lambda$ and $\mu$ satisfy $\lambda \geq 0$, $\mu \geq 0$, $\lambda+\mu \leq 1$, wherein $\lambda$ is a first real number, wherein $\mu$ is a second real number,
wherein a is a first vector comprising two first vector components, wherein a indicates the first loudspeaker position, wherein a first one of the two first vector components indicates a first coordinate value of the first loudspeaker position within the two-dimensional coordinate system, and wherein a second one of the two first vector components indicates a second coordinate value of the first loudspeaker position within the two-dimensional coordinate system,
wherein b is a second vector comprising two second vector components, wherein b indicates the second loudspeaker position, wherein a first one of the two second vector components indicates a first coordinate value of the second loudspeaker position within the two-dimensional coordinate system, and wherein a second one of the two second vector components indicates a second coordinate value of the second loudspeaker position within the two-dimensional coordinate system,
wherein c is a third vector comprising two third vector components, wherein c indicates the third loudspeaker position, wherein a first one of the two third vector components indicates a first coordinate value of the third loudspeaker position within the two-dimensional coordinate system, and wherein a second one of the two third vector components indicates a second coordinate value of the third loudspeaker position within the two-dimensional coordinate system,
wherein p is a fourth vector comprising two fourth vector components, wherein p indicates the panning position, wherein a first one of the two fourth vector components indicates a first coordinate value of the panning position within the two-dimensional coordinate system, and wherein a second one of the two fourth vector components indicates a second coordinate value of the panning position within the two-dimensional coordinate system.

37. The apparatus according to claim 35, wherein the panning gain determiner is configured to calculate, for each audio output signal of the four or more audio output signals, the panning gain for said audio output signal depending on a first distance being a shortest distance between the panning position and a first straight line through the two further loudspeaker positions of the group of associated loudspeaker positions, and depending on a second distance, being a shortest distance between the loudspeaker position being associated with said audio output signal and a second straight line through the panning position, wherein said second straight line is parallel to said first straight line.

38. The apparatus according to claim 35,
wherein the panning gain determiner is configured to calculate, for each audio output signal of the four or more audio output signals, the panning gain depending of a ratio of a first distance and a sum of a first distance and the second distance,
wherein first distance indicates a shortest distance between the panning position and a first straight line through the two further loudspeaker positions of the group of associated loudspeaker positions, and
wherein the second distance indicates a shortest distance between the loudspeaker position being associated with said audio output signal position and a second straight line through the panning position, wherein said second straight line is parallel to said first straight line.

39. The apparatus according to claim 36,
wherein, for each of the four or more audio output signals, the panning gain determiner is configured to determine said panning gain according to the formula $g=1-n(p-a)$ wherein g is said panning gain,
wherein n is a fifth vector being defined according to $$n = \frac{n'}{n'(b-a)},$$

wherein n' is a sixth vector being defined according to $n'=[\phi_b-\phi_c,\theta_c-\theta_b]^T$, wherein $\theta_b$ indicates the first coordinate value of the loudspeaker position, being assigned to the second audio output signal,
wherein $\phi_b$ indicates the second coordinate value of the loudspeaker position, being assigned to the second audio output signal,
wherein $\theta_c$ indicates the first coordinate value of the loudspeaker position, being assigned to the third audio output signal, and
wherein $\phi_c$ indicates the second coordinate value of the loudspeaker position, being assigned to the third audio output signal.

40. The apparatus according to claim 28,
wherein the audio input signal comprises a plurality of audio input samples, and
wherein the signal processor is configured to generate each audio output signal of the four or more audio output signals by multiplying each of one or more of the audio input samples of the audio input signal with the panning gain for said audio output signal to acquire one or more audio output samples of the audio output signal.

41. The apparatus according to claim 28,
wherein the audio input signal comprises a plurality of audio input samples, and
wherein the signal processor is configured to generate each audio output signal of the four or more audio output signals by multiplying each of one or more of the audio input samples of the audio input signal with a square root of the panning gain for said audio output signal to acquire one or more audio output samples of the audio output signal.

42. The apparatus according to claim 28,
wherein the panning gain determiner is configured to determine the panning gain for each audio output signal of the four or more audio output signals for a first point in time as a first time-dependent panning gain for said audio output signal, and
wherein the panning gain determiner is configured to determine a further panning gain for each audio output signal of the four or more audio output signals for a different second point in time as a second time-dependent panning gain for said audio output signal, said second time-dependent panning gain being different from the first time-dependent panning gain for said audio output signal.

43. The apparatus according to claim 28,
wherein the panning gain determiner is configured to determine the panning gain for each audio output signal of the four or more audio output signals for a first frequency as a first frequency-dependent panning gain for said audio output signal, and
wherein the panning gain determiner is configured to determine a further panning gain for each audio output signal of the four or more audio output signals for a different second frequency as a second frequency-dependent panning gain for said audio output signal, said second frequency-dependent panning gain being different from the first frequency-dependent panning gain for said audio output signal.

44. The apparatus according to claim 28, comprising:
wherein the audio input signal is a first audio input signal, wherein the panning position is a first panning position, wherein the group of associated loudspeaker positions for each audio output signal of the four or more audio output signals is a first group of associated loudspeaker positions for said audio output signal, and wherein the panning gain is a first input-signal-dependent panning gain,
wherein the panning gain determiner is configured to determine, for each audio output signal of the four or more audio output signals, one or more further groups of associated output signals, being associated with said audio output signal, wherein the panning gain determiner is configured to determine each further group of the one or more further groups depending on the loudspeaker position of each of the four or more audio output signals and depending on a further panning position, so that said further group of associated loudspeaker positions comprises said audio output signal and at least two further audio output signals of the four or more audio output signals, wherein at least one of the four or more audio output signals is not comprised by said further group of associated loudspeaker positions,
wherein the panning gain determiner is configured to calculate, for each audio output signal of the four or more audio output signals, one or more further input-signal-dependent panning gains for said audio output signal depending on the further panning position and depending on the loudspeaker position of each associated output signal of one of the one or more further groups of associated output signals, and
wherein the signal processor is configured to generate each audio output signal of the four or more audio output signals depending on the first input-signal-dependent panning gain for said audio output signal, depending on the one or more further input-signal-dependent panning gains for said audio output signal, depending on the first audio input signal, and depending on one or more further audio input signals.

45. A method for generating four or more audio output signals, wherein each loudspeaker position of four or more loudspeaker positions is associated with exactly one of the four or more audio output signals, and wherein each of the four or more audio output signals is associated with exactly one of the four or more loudspeaker positions, wherein the method comprises:
determining, for each audio output signal of the four or more audio output signals, a group of associated loudspeaker positions, being associated with said audio output signal, depending on the loudspeaker position of each of the four or more audio output signals and depending on a panning position, so that said group of associated loudspeaker positions comprises the loudspeaker position being associated with said audio output signal and at least two further loudspeaker positions of the four or more loudspeaker positions, wherein at least one of the four or more loudspeaker positions is not comprised by said group of associated loudspeaker positions,
calculating, for each audio output signal of the four or more audio output signals, the panning gain for said audio output signal depending on the panning position and depending on the loudspeaker positions of the group of associated loudspeaker positions being associated with said audio output signal, and
generating each audio output signal of the four or more audio output signals depending on the panning gain for said audio output signal and depending on an audio input signal,
wherein the group of associated loudspeaker positions being associated with a first one of the four or more audio output signals is not equal to the group of associated loudspeaker positions being associated with a different second one of the four or more audio output signals.

46. A non-transitory digital storage medium having stored thereon a computer program for performing a method for generating four or more audio output signals, wherein each loudspeaker position of four or more loudspeaker positions is associated with exactly one of the four or more audio output signals, and wherein each of the four or more audio output signals is associated with exactly one of the four or more loudspeaker positions, wherein the method comprises:
determining, for each audio output signal of the four or more audio output signals, a group of associated loudspeaker positions, being associated with said audio output signal, depending on the loudspeaker position of each of the four or more audio output signals and depending on a panning position, so that said group of associated loudspeaker positions comprises the loudspeaker position being associated with said audio output signal and at least two further loudspeaker positions of the four or more loudspeaker positions, wherein at least one of the four or more loudspeaker positions is not comprised by said group of associated loudspeaker positions,
calculating, for each audio output signal of the four or more audio output signals, the panning gain for said audio output signal depending on the panning position and depending on the loudspeaker positions of the group of associated loudspeaker positions being associated with said audio output signal, and generating each audio output signal of the four or more audio output signals depending on the panning gain for said audio output signal and depending on an audio input signal, wherein the group of associated loudspeaker positions being associated with a first one of the four or more audio output signals is not equal to the group of associated loudspeaker positions being associated with a different second one of the four or more audio output signals, when being executed on a computer or signal processor.

* * * * *